(12) United States Patent
Steiner et al.

(10) Patent No.: US 8,990,665 B1
(45) Date of Patent: Mar. 24, 2015

(54) SYSTEM, METHOD AND COMPUTER PROGRAM PRODUCT FOR JOINT SEARCH OF A READ THRESHOLD AND SOFT DECODING

(75) Inventors: Avi Steiner, Kiryat Motzkin (IL);
Hanan Weingarten, Herzelia (IL); Erez Sabbag, Kiryat Tivon (IL)

(73) Assignee: Densbits Technologies Ltd., Haifa (IL)

( * ) Notice: Subject to any disclaimer, the term of this patent is extended or adjusted under 35 U.S.C. 154(b) by 260 days.

(21) Appl. No.: 13/420,032

(22) Filed: Mar. 14, 2012

Related U.S. Application Data

(60) Provisional application No. 61/472,557, filed on Apr. 6, 2011.

(51) Int. Cl.
| | | |
|---|---|---|
| *G11C 29/00* | (2006.01) |
| *H03M 13/00* | (2006.01) |
| *G11C 11/56* | (2006.01) |
| *H03M 13/45* | (2006.01) |
| *G11C 16/04* | (2006.01) |
| *H03M 13/37* | (2006.01) |

(52) U.S. Cl.
CPC ............ *G11C 11/5642* (2013.01); *H03M 13/45* (2013.01); *G11C 16/04* (2013.01); *H03M 13/37* (2013.01)
USPC ............................ 714/780; 714/769; 714/770

(58) Field of Classification Search
CPC .... G11C 11/5642; G11C 16/26; G11C 16/04; G11C 2211/5641; G06F 11/1072; G06F 11/1068; G06F 11/1008; G06F 11/1012; G06F 11/08; G06F 11/1044; G06F 12/0246; G06F 11/1048; H03M 13/1111; H03M 13/37; H03M 13/458; H03M 13/43; H03M 13/1108; H03M 13/3784; H03M 13/1105; H03M 13/45

USPC ......... 714/780, 769–770, 773, 763, 799–800, 714/819, 746, 718, 721; 365/189.011, 365/189.04, 189.14, 189.15, 189.07, 200, 365/201, 220, 221
See application file for complete search history.

(56) References Cited

U.S. PATENT DOCUMENTS

| | | | |
|---|---|---|---|
| 4,430,701 A | 2/1984 | Christian et al. |
| 4,463,375 A | 7/1984 | Macovski |
| 4,584,686 A | 4/1986 | Fritze |
| 4,589,084 A | 5/1986 | Fling et al. |
| 4,777,589 A | 10/1988 | Boettner et al. |
| 4,866,716 A | 9/1989 | Weng |

(Continued)

FOREIGN PATENT DOCUMENTS

WO  WO 2008/053472 A2 * 5/2008

OTHER PUBLICATIONS

Search Report of PCT Patent Application WO 2009/118720 A3.
(Continued)

*Primary Examiner* — Christine Tu
(74) *Attorney, Agent, or Firm* — Dentons US LLP

(57) ABSTRACT

A flash memory controller, a computer readable medium and a method. The method may include performing, by a flash memory controller, multiple read attempts of a group of flash memory cells, using multiple read thresholds, to provide multiple read results; determining, by the flash memory controller and based upon the multiple read results, a reliability metric of each of the multiple read results; and error correction decoding the multiple read results based upon reliability metrics associated with the multiple read results.

48 Claims, 12 Drawing Sheets

(56) References Cited

U.S. PATENT DOCUMENTS

| | | |
|---|---|---|
| 5,003,597 A | 3/1991 | Merkle |
| 5,077,737 A | 12/1991 | Leger et al. |
| 5,297,153 A | 3/1994 | Baggen et al. |
| 5,305,276 A | 4/1994 | Uenoyama |
| 5,592,641 A | 1/1997 | Doyle et al. |
| 5,623,620 A | 4/1997 | Doyle et al. |
| 5,640,529 A | 6/1997 | Hasbun |
| 5,657,332 A | 8/1997 | Auclair et al. |
| 5,663,901 A | 9/1997 | Harari et al. |
| 5,724,538 A | 3/1998 | Morris et al. |
| 5,729,490 A | 3/1998 | Calligaro et al. |
| 5,740,395 A | 4/1998 | Wells et al. |
| 5,745,418 A | 4/1998 | Hu et al. |
| 5,778,430 A | 7/1998 | Ish et al. |
| 5,793,774 A | 8/1998 | Usui et al. |
| 5,920,578 A | 7/1999 | Zook et al. |
| 5,926,409 A | 7/1999 | Engh et al. |
| 5,933,368 A | 8/1999 | Hu et al. |
| 5,956,268 A | 9/1999 | Lee |
| 5,956,473 A | 9/1999 | Hu et al. |
| 5,968,198 A | 10/1999 | Balachandran |
| 5,982,659 A | 11/1999 | Irrinki et al. |
| 6,011,741 A | 1/2000 | Harari et al. |
| 6,016,275 A | 1/2000 | Han |
| 6,038,634 A | 3/2000 | Ji et al. |
| 6,081,878 A | 6/2000 | Estakhri et al. |
| 6,094,465 A | 7/2000 | Stein et al. |
| 6,119,245 A | 9/2000 | Hiratsuka |
| 6,182,261 B1 | 1/2001 | Haller et al. |
| 6,192,497 B1 | 2/2001 | Yang et al. |
| 6,195,287 B1 | 2/2001 | Hirano |
| 6,199,188 B1 | 3/2001 | Shen et al. |
| 6,209,114 B1 | 3/2001 | Wolf et al. |
| 6,259,627 B1 | 7/2001 | Wong |
| 6,272,052 B1 | 8/2001 | Miyauchi |
| 6,278,633 B1 | 8/2001 | Wong et al. |
| 6,279,133 B1 | 8/2001 | Vafai et al. |
| 6,301,151 B1 | 10/2001 | Engh et al. |
| 6,370,061 B1 | 4/2002 | Yachareni et al. |
| 6,374,383 B1 | 4/2002 | Weng |
| 6,504,891 B1 | 1/2003 | Chevallier |
| 6,532,169 B1 | 3/2003 | Mann et al. |
| 6,532,556 B1 | 3/2003 | Wong et al. |
| 6,553,533 B2 | 4/2003 | Demura et al. |
| 6,560,747 B1 | 5/2003 | Weng |
| 6,637,002 B1 | 10/2003 | Weng et al. |
| 6,639,865 B2 | 10/2003 | Kwon |
| 6,674,665 B1 | 1/2004 | Mann et al. |
| 6,675,281 B1 | 1/2004 | Oh et al. |
| 6,704,902 B1 | 3/2004 | Shinbashi et al. |
| 6,751,766 B2 | 6/2004 | Guterman et al. |
| 6,772,274 B1 | 8/2004 | Estakhri |
| 6,781,910 B2 | 8/2004 | Smith |
| 6,792,569 B2 | 9/2004 | Cox et al. |
| 6,873,543 B2 | 3/2005 | Smith et al. |
| 6,891,768 B2 | 5/2005 | Smith et al. |
| 6,914,809 B2 | 7/2005 | Hilton et al. |
| 6,915,477 B2 | 7/2005 | Gollamudi et al. |
| 6,952,365 B2 | 10/2005 | Gonzalez et al. |
| 6,961,890 B2 | 11/2005 | Smith |
| 6,968,421 B2 | 11/2005 | Conley |
| 6,990,012 B2 | 1/2006 | Smith et al. |
| 6,996,004 B1 | 2/2006 | Fastow et al. |
| 6,999,854 B2 | 2/2006 | Roth |
| 7,010,739 B1 | 3/2006 | Feng et al. |
| 7,012,835 B2 | 3/2006 | Gonzalez et al. |
| 7,038,950 B1 | 5/2006 | Hamilton et al. |
| 7,068,539 B2 | 6/2006 | Guterman et al. |
| 7,079,436 B2 | 7/2006 | Perner et al. |
| 7,149,950 B2 | 12/2006 | Spencer et al. |
| 7,177,977 B2 | 2/2007 | Chen et al. |
| 7,188,228 B1 | 3/2007 | Chang et al. |
| 7,191,379 B2 | 3/2007 | Adelmann et al. |
| 7,196,946 B2 | 3/2007 | Chen et al. |
| 7,203,874 B2 | 4/2007 | Roohparvar |
| 7,212,426 B2 | 5/2007 | Park et al |
| 7,290,203 B2 | 10/2007 | Emma et al. |
| 7,292,365 B2 | 11/2007 | Knox |
| 7,301,928 B2 | 11/2007 | Nakabayashi et al. |
| 7,315,916 B2 | 1/2008 | Bennett et al. |
| 7,388,781 B2 | 6/2008 | Litsyn et al. |
| 7,395,404 B2 | 7/2008 | Gorobets et al. |
| 7,441,067 B2 | 10/2008 | Gorobets et al. |
| 7,443,729 B2 | 10/2008 | Li et al. |
| 7,450,425 B2 | 11/2008 | Aritome |
| 7,454,670 B2 | 11/2008 | Kim et al. |
| 7,466,575 B2 | 12/2008 | Shalvi et al. |
| 7,533,328 B2 | 5/2009 | Alrod et al. |
| 7,558,109 B2 | 7/2009 | Brandman et al. |
| 7,593,263 B2 | 9/2009 | Sokolov et al. |
| 7,610,433 B2 | 10/2009 | Randell et al. |
| 7,613,043 B2 | 11/2009 | Cornwell et al. |
| 7,619,922 B2 | 11/2009 | Li et al. |
| 7,697,326 B2 | 4/2010 | Sommer et al. |
| 7,706,182 B2 | 4/2010 | Shalvi et al. |
| 7,716,538 B2 | 5/2010 | Gonzalez et al. |
| 7,804,718 B2 | 9/2010 | Kim |
| 7,805,663 B2 | 9/2010 | Brandman et al. |
| 7,805,664 B1 | 9/2010 | Yang et al. |
| 7,844,877 B2 | 11/2010 | Litsyn et al. |
| 7,911,848 B2 | 3/2011 | Eun et al. |
| 7,961,797 B1 | 6/2011 | Yang et al. |
| 7,975,192 B2 | 7/2011 | Sommer et al. |
| 8,020,073 B2 | 9/2011 | Emma et al. |
| 8,108,590 B2 | 1/2012 | Chow et al. |
| 8,122,328 B2 | 2/2012 | Liu et al. |
| 8,159,881 B2 | 4/2012 | Yang |
| 8,190,961 B1 | 5/2012 | Yang et al. |
| 8,225,181 B2 * | 7/2012 | Perlmutter et al. ........... 714/773 |
| 8,250,324 B2 | 8/2012 | Haas et al. |
| 8,300,823 B2 | 10/2012 | Bojinov et al. |
| 8,305,812 B2 | 11/2012 | Levy et al. |
| 8,327,246 B2 | 12/2012 | Weingarten et al. |
| 8,407,560 B2 | 3/2013 | Ordentlich et al. |
| 8,417,893 B2 | 4/2013 | Khmelnitsky et al. |
| 8,693,258 B2 * | 4/2014 | Weingarten et al. ....... 365/185.2 |
| 2001/0034815 A1 | 10/2001 | Dugan et al. |
| 2002/0063774 A1 | 5/2002 | Hillis et al. |
| 2002/0085419 A1 | 7/2002 | Kwon et al. |
| 2002/0154769 A1 | 10/2002 | Petersen et al. |
| 2002/0156988 A1 | 10/2002 | Toyama et al. |
| 2002/0174156 A1 | 11/2002 | Birru et al. |
| 2003/0014582 A1 | 1/2003 | Nakanishi |
| 2003/0065876 A1 | 4/2003 | Lasser |
| 2003/0101404 A1 | 5/2003 | Zhao et al. |
| 2003/0105620 A1 | 6/2003 | Bowen |
| 2003/0177300 A1 | 9/2003 | Lee et al. |
| 2003/0192007 A1 | 10/2003 | Miller et al. |
| 2004/0015771 A1 | 1/2004 | Lasser et al. |
| 2004/0030971 A1 | 2/2004 | Tanaka et al. |
| 2004/0059768 A1 | 3/2004 | Denk et al. |
| 2004/0080985 A1 | 4/2004 | Chang et al. |
| 2004/0153722 A1 | 8/2004 | Lee |
| 2004/0153817 A1 | 8/2004 | Norman et al. |
| 2004/0181735 A1 | 9/2004 | Xin |
| 2004/0203591 A1 | 10/2004 | Lee |
| 2004/0210706 A1 | 10/2004 | In et al. |
| 2005/0013165 A1 | 1/2005 | Ban |
| 2005/0018482 A1 | 1/2005 | Cemea et al. |
| 2005/0083735 A1 | 4/2005 | Chen et al. |
| 2005/0117401 A1 | 6/2005 | Chen et al. |
| 2005/0120265 A1 | 6/2005 | Pline et al. |
| 2005/0128811 A1 | 6/2005 | Kato et al. |
| 2005/0138533 A1 | 6/2005 | Le Bars et al. |
| 2005/0144213 A1 | 6/2005 | Simkins et al. |
| 2005/0144368 A1 | 6/2005 | Chung et al. |
| 2005/0169057 A1 | 8/2005 | Shibata et al. |
| 2005/0172179 A1 | 8/2005 | Brandenberger et al. |
| 2005/0213393 A1 | 9/2005 | Lasser |
| 2005/0243626 A1 | 11/2005 | Ronen |
| 2006/0059406 A1 | 3/2006 | Micheloni et al. |
| 2006/0059409 A1 | 3/2006 | Lee |
| 2006/0064537 A1 | 3/2006 | Oshima et al. |
| 2006/0101193 A1 | 5/2006 | Murin |

(56) References Cited

U.S. PATENT DOCUMENTS

| | | |
|---|---|---|
| 2006/0195651 A1 | 8/2006 | Estakhri et al. |
| 2006/0203587 A1 | 9/2006 | Li et al. |
| 2006/0221692 A1 | 10/2006 | Chen |
| 2006/0248434 A1 | 11/2006 | Radke et al. |
| 2006/0268608 A1 | 11/2006 | Noguchi et al. |
| 2006/0282411 A1 | 12/2006 | Fagin et al. |
| 2006/0284244 A1 | 12/2006 | Forbes et al. |
| 2006/0294312 A1 | 12/2006 | Walmsley |
| 2007/0025157 A1 | 2/2007 | Wan et al. |
| 2007/0063180 A1 | 3/2007 | Asano et al. |
| 2007/0081388 A1 | 4/2007 | Joo |
| 2007/0098069 A1 | 5/2007 | Gordon |
| 2007/0103992 A1 | 5/2007 | Sakui et al. |
| 2007/0104004 A1 | 5/2007 | So et al. |
| 2007/0109858 A1 | 5/2007 | Conley et al. |
| 2007/0124652 A1 | 5/2007 | Litsyn et al. |
| 2007/0140006 A1 | 6/2007 | Chen et al. |
| 2007/0143561 A1 | 6/2007 | Gorobets |
| 2007/0150694 A1 | 6/2007 | Chang et al. |
| 2007/0168625 A1 | 7/2007 | Cornwell et al. |
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226582 A1 | 9/2007 | Tang et al. |
| 2007/0226592 A1 | 9/2007 | Radke |
| 2007/0228449 A1 | 10/2007 | Takano et al. |
| 2007/0253249 A1 | 11/2007 | Kang et al. |
| 2007/0253250 A1 | 11/2007 | Shibata et al. |
| 2007/0263439 A1 | 11/2007 | Cornwell et al. |
| 2007/0266291 A1 | 11/2007 | Toda et al. |
| 2007/0271494 A1 | 11/2007 | Gorobets |
| 2007/0297226 A1 | 12/2007 | Mokhlesi |
| 2008/0010581 A1 | 1/2008 | Alrod et al. |
| 2008/0028014 A1 | 1/2008 | Hilt et al. |
| 2008/0049497 A1 | 2/2008 | Mo |
| 2008/0055989 A1 | 3/2008 | Lee et al. |
| 2008/0082897 A1 | 4/2008 | Brandman et al. |
| 2008/0092026 A1 | 4/2008 | Brandman et al. |
| 2008/0104309 A1 | 5/2008 | Cheon et al. |
| 2008/0112238 A1 | 5/2008 | Kim et al. |
| 2008/0116509 A1 | 5/2008 | Harari et al. |
| 2008/0126686 A1 | 5/2008 | Sokolov et al. |
| 2008/0127104 A1 | 5/2008 | Li et al. |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0137414 A1 | 6/2008 | Park et al. |
| 2008/0141043 A1 | 6/2008 | Flynn et al. |
| 2008/0148115 A1 | 6/2008 | Sokolov et al. |
| 2008/0158958 A1 | 7/2008 | Shalvi et al. |
| 2008/0159059 A1 | 7/2008 | Moyer |
| 2008/0162079 A1 | 7/2008 | Astigarraga et al. |
| 2008/0168216 A1 | 7/2008 | Lee |
| 2008/0168320 A1 | 7/2008 | Cassuto et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0201620 A1 | 8/2008 | Gollub |
| 2008/0209114 A1 | 8/2008 | Chow et al. |
| 2008/0219050 A1 | 9/2008 | Shalvi et al. |
| 2008/0225599 A1 | 9/2008 | Chae |
| 2008/0250195 A1 | 10/2008 | Chow et al. |
| 2008/0263262 A1 | 10/2008 | Sokolov et al. |
| 2008/0282106 A1 | 11/2008 | Shalvi et al. |
| 2008/0285351 A1 | 11/2008 | Shlick et al. |
| 2008/0301532 A1 | 12/2008 | Uchikawa et al. |
| 2009/0024905 A1 | 1/2009 | Shalvi et al. |
| 2009/0027961 A1 | 1/2009 | Park et al. |
| 2009/0043951 A1 | 2/2009 | Shalvi et al. |
| 2009/0046507 A1 | 2/2009 | Aritome |
| 2009/0072303 A9 | 3/2009 | Prall et al. |
| 2009/0091979 A1 | 4/2009 | Shalvi |
| 2009/0103358 A1 | 4/2009 | Sommer et al. |
| 2009/0106485 A1 | 4/2009 | Anholt |
| 2009/0113275 A1 | 4/2009 | Chen et al. |
| 2009/0125671 A1 | 5/2009 | Flynn et al. |
| 2009/0132755 A1 | 5/2009 | Radke |
| 2009/0144598 A1 | 6/2009 | Yoon et al. |
| 2009/0144600 A1 | 6/2009 | Perlmutter et al. |
| 2009/0150599 A1 | 6/2009 | Bennett |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2009/0282185 A1 | 11/2009 | Van Cauwenbergh |
| 2009/0282186 A1 | 11/2009 | Mokhlesi et al. |
| 2009/0287930 A1 | 11/2009 | Nagaraja |
| 2009/0300269 A1 | 12/2009 | Radke et al. |
| 2009/0323942 A1 | 12/2009 | Sharon et al. |
| 2010/0005270 A1 | 1/2010 | Jiang |
| 2010/0025811 A1 | 2/2010 | Bronner et al. |
| 2010/0030944 A1 | 2/2010 | Hinz |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0149881 A1 | 6/2010 | Lee et al. |
| 2010/0172179 A1 | 7/2010 | Gorobets et al. |
| 2010/0174853 A1 | 7/2010 | Lee et al. |
| 2010/0180073 A1 | 7/2010 | Weingarten et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0241793 A1 | 9/2010 | Sugimoto et al. |
| 2010/0246265 A1 | 9/2010 | Moschiano et al. |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0269008 A1 | 10/2010 | Leggette et al. |
| 2010/0293321 A1 | 11/2010 | Weingarten |
| 2010/0318724 A1 | 12/2010 | Yeh |
| 2011/0051521 A1 | 3/2011 | Levy et al. |
| 2011/0055461 A1 | 3/2011 | Steiner et al. |
| 2011/0093650 A1 | 4/2011 | Kwon et al. |
| 2011/0096612 A1 | 4/2011 | Steiner et al. |
| 2011/0099460 A1 | 4/2011 | Dusija et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0194353 A1 | 8/2011 | Hwang et al. |
| 2011/0209028 A1 | 8/2011 | Post et al. |
| 2011/0214029 A1 | 9/2011 | Steiner et al. |
| 2011/0214039 A1 | 9/2011 | Steiner et al. |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |
| 2012/0005554 A1 | 1/2012 | Steiner et al. |
| 2012/0005558 A1 | 1/2012 | Steiner et al. |
| 2012/0005560 A1 | 1/2012 | Steiner et al. |

(56) References Cited

U.S. PATENT DOCUMENTS

| | | |
|---|---|---|
| 2012/0008401 A1 | 1/2012 | Katz et al. |
| 2012/0008414 A1 | 1/2012 | Katz et al. |
| 2012/0017136 A1 | 1/2012 | Ordentlich et al. |
| 2012/0051144 A1 | 3/2012 | Weingarten et al. |
| 2012/0063227 A1 | 3/2012 | Weingarten et al. |
| 2012/0066441 A1 | 3/2012 | Weingarten |
| 2012/0110250 A1 | 5/2012 | Sabbag et al. |
| 2012/0124273 A1 | 5/2012 | Goss et al. |
| 2012/0246391 A1 | 9/2012 | Meir et al. |

OTHER PUBLICATIONS

Search Report of PCT Patent Application WO 2009/095902 A3.
Search Report of PCT Patent Application WO 2009/078006 A3.
Search Report of PCT Patent Application WO 2009/074979 A3.
Search Report of PCT Patent Application WO 2009/074978 A3.
Search Report of PCT Patent Application WO 2009/072105 A3.
Search Report of PCT Patent Application WO 2009/072104 A3.
Search Report of PCT Patent Application WO 2009/072103 A3.
Search Report of PCT Patent Application WO 2009/072102 A3.
Search Report of PCT Patent Application WO 2009/072101 A3.
Search Report of PCT Patent Application WO 2009/072100 A3.
Search Report of PCT Patent Application WO 2009/053963 A3.
Search Report of PCT Patent Application WO 2009/053962 A3.
Search Report of PCT Patent Application WO 2009/053961 A3.
Search Report of PCT Patent Application WO 2009/037697 A3.
Yani Chen, Keshab K. Parhi, "Small Area Parallel Chien Search Architectures for Long BCH Codes", Ieee Transactions on Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, pp. II-369-72 vol. 2.
Michael Purser, "Introduction to Error Correcting Codes", Artech House Inc., 1995.
Ron M. Roth, "Introduction to Coding Theory", Cambridge University Press, 2006.
Akash Kumar, Sergei Sawitzki, "High-Throughput and Low Power Architectures for Reed Solomon Decoder", (a.kumar at tue.nl, Eindhoven University of Technology and sergei.sawitzki at philips.com).
Todd K.Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique", Ieee Transactions on Electron Devices, vol. 47, No. 4, Apr. 2000.
Giovanni Campardo, Rino Micheloni, David Novosel, "VLSI-Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built in Self Diagnosis", ITC International Test Conference, Paper 2.1.
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A. Scarpa, J. Dijkstra, W. Stidl, F. Kuper, "Data retention prediction for modern floating gate non volatile memories", Microelectronics Reliability 40 (2000), 1561-1566.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995.
Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell NROM Reliability", Appears on the website of Saifun.com.
Paulo Cappelletti, Clara Golla, Piero Olivo, Enrico Zanoni, "Flash Memories", Kluwer Academic Publishers, 1999.
Dempster, et al., "Maximum Likelihood from Incomplete Data via the EM Algorithm", Journal of the Royal Statistical Society. Series B (Methodological), vol. 39, No. 1 (1997), pp. 1-38.
Mielke, et al., "Flash EEPROM Threshold Instabilities due to Charge Trapping During Program/Erase Cycling", IEEE Transactions on Device and Materials Reliability, vol. 4, No. 3, Sep. 2004, pp. 335-344.
Daneshbeh, "Bit Serial Systolic Architectures for Multiplicative Inversion and Division over GF (2)", A thesis presented to the University of Waterloo, Ontario, Canada, 2005, pp. 1-118.
Chen, Formulas for the solutions of Quadratic Equations over GF (2), IEEE Trans. Inform. Theory, vol. IT-28, No. 5, Sep. 1982, pp. 792-794.
Berlekamp et al., "On the Solution of Algebraic Equations over Finite Fields", Inform. Cont. 10, Oct. 1967, pp. 553-564.

* cited by examiner

SYSTEM, METHOD AND COMPUTER PROGRAM PRODUCT FOR JOINT SEARCH OF A READ THRESHOLD AND SOFT DECODING

RELATED APPLICATIONS

This application is a NONPROVISIONAL of, claims priority to and incorporates by reference U.S. provisional patent application No. 61/472,557, filing date 6 Apr. 2011.

BACKGROUND OF THE INVENTION

High resolution read attempts of a Flash memory device include many read attempts that differ from by their read thresholds, wherein these read thresholds are proximate to each other. These high resolution read attempts are time consuming.

These read attempts include (a) read attempts that are solely dedicated for finding a desired read threshold, and (b) read attempts that solely dedicated for soft decoding.

The finding of the desired read threshold involves operating a Digital Signal Processor (DSP) to set the desired read threshold.

After the finding, additional read attempts are used for generating reliability-metrics for a soft decoding process.

FIG. 1 illustrates a voltage threshold distribution of a 2-bit per cell (bpc) memory device. Four lobes 10-13 slightly overlap and are read by one MSB (Most Significant Bit) threshold 18 and two LSB (Least Significant bit) thresholds denoted 17 and 19.

As indicated above—a read attempt for 2 bpc memory page may require reading a MSB page, by using a single MSB read threshold (in case there are not too many errors).

The MSB read threshold in this example for reading the MSB page bits is denoted by $X_{th,1}$ 18. For reading the LSB page bits, it is required to read using two LSB read thresholds (in case there are not too many errors), which are denoted $X_{th,0}$, and $X_{th,2}$ 17 and 19.

It is noted that the distribution of threshold voltages illustrated in FIG. 1 as well as any such threshold voltage distribution may change over time and due to multiple program/erase (P/E) operations.

In FIG. 1, for example, reading the MSB page bits with soft input may require sampling multiple times around threshold $X_{th,1}$ 18 and to provide reliability metrics accordingly. For providing soft input to the decoder when reading the LSB page bits, it is required to perform multiple read attempts around $X_{th,0}$, 17 and $X_{th,2}$ 19.

In order to perform soft sampling there is usually a DSP operation for searching the best initial read thresholds, around which the soft sampling takes place. This is required since the initial thresholds, which may be either default thresholds or some estimation based on previous read attempt, can be irrelevant. This is due to aging effects of memory cells, which result in distribution change over time and cycles. After a DSP operation for initial read thresholds estimation, a high resolution read attempt is done for providing inputs for the soft input decoder. A schematic block diagram of the described flow is provided in FIG. 2.

FIG. 2 illustrates a flash memory array 21 that is read by a DSP 22 that is arranged to perform read threshold estimation and to find a desired read threshold. After the DSP 22 determines the desired read threshold 25, a sampler 23 performs high resolution sampling of the flash memory array 21 to provide soft information. The sampler 23 is not provided with the read results obtained by the DSP 22. The sampler 23 provides soft information 26 to an Error Correction Code (ECC) decoder 24 that performs a soft decoding process to provide decoded output.

There is a need to reduce the soft read penalty.

SUMMARY OF THE INVENTION

There may be provided joint digital signal processing (DSP) and error correction code (ECC) operation for reading data from a flash memory device. This may reduce the inherent overhead in producing soft information to a decoder. This overhead usually involves read attempts intended for characterizing the current page/codeword associated flash memory cells statistical distribution. Once the statistical characterization is sufficiently revealed and a desired read threshold (or thresholds) is set it is possible to perform soft sampling, which provides a high resolution read of the memory cells, to be used by the decoder.

It may be suggested to utilize the results of the read attempts which are used for statistical characterization as part of the soft information. If needed, complement the statistical characterization process using the ECC. For example, partial decoding can be employed, and the decoder can provide scores per different input hypotheses (this is described in more detail later). Once the statistical characterization process is complete, additional read attempts may take place to provide a high resolution soft input, which can be, for example, a reliability-metric per input bit for the decoder.

Since the statistical distribution of the threshold voltages changes over the Flash memory device life span, a read attempt may require learning the statistics and only then placing the thresholds for the read attempt which is used as input for the decoder. In case there are not too many errors, a hard input for the decoder may suffice once the statistics is known up to a sufficiently high accuracy. It is mainly required for setting read threshold such that a minimal number of read errors are obtained for the decoder inputs.

When there are relatively many errors, it may not be enough to provide just a single hard decision input, which is obtained by a single read, to the decoder. In such cases, a soft decoder may be applied when soft information, such as reliability information, for each bit is provided to the decoder. This reliability information is achieved by performing multiple read attempts using different read thresholds.

According to an embodiment of the invention a method may be provided and may include performing, by a flash memory controller, multiple read attempts of a group of flash memory cells, using multiple read thresholds, to provide multiple read results; determining, by the flash memory controller and based upon the multiple read results, a reliability metric of each of the multiple read results; and error correction decoding the multiple read results based upon reliability metrics associated with the multiple read results.

The method may include finding, based upon the multiple read results, at least one desired read threshold to be applied during future read attempts.

The method may include evaluating a characteristic of the multiple read results under different assumptions about mapping between the read thresholds and reliability metrics.

The characteristic may be a bit error rate metric associated with an outcome of a soft decoding process or a partial soft decoding process applied on the multiple read results.

The characteristic may be a bit error rate metric associated with an outcome of a hard decoding process or a partial hard decoding process applied on the multiple read results.

The different assumptions about the identity of the desired read threshold may differ from each other by a reliability associated with each of the multiple read results.

The method may include evaluating the characteristic of the multiple read thresholds under each assumption by comparing between (a) a relationship between numbers of first and second read results of different values, and (b) an expected relationship between numbers of first and second read results of different numbers.

The method may include evaluating the characteristic of the multiple read thresholds under each assumption by performing a partial decoding process of the multiple read results.

The partial decoding may be a partial soft decoding.

The partial soft decoding may involve applying iterations of soft decoding of a lowest decoding complexity.

The partial decoding may be a partial hard decoding.

The method may include evaluating the characteristic of the multiple read thresholds by checking a distribution of thresholds voltages of the group of memory cells under the different assumptions.

The selecting of the desired read threshold may be followed by performing at least one additional read attempt to provide additional read results and determining, based upon the at least one additional read result, a reliability of the at least one additional read result.

The method may include soft decoding the multiple read results.

The method may include performing additional read results using additional read thresholds, after finding the desired read threshold, wherein the additional read thresholds are proximate to the desired read threshold.

The additional read thresholds may be selected such that there are at least a predefined number of read thresholds that are proximate to the desired read threshold and are positioned at each side of the desired read threshold, as to provide the decoder with high resolution sampling for soft information.

The first and second read attempts may be executed before a completion of a determination of a desired read threshold.

According to an embodiment of the invention a method may be provided and may include starting a search for near optimum reliability metrics mapping related to multiple read thresholds; computing a histogram that represents a voltage threshold distribution obtained when performing multiple read attempts using the multiple read thresholds; activating a particle hard decoding for at least some of the multiple read thresholds and calculating a hard decoding score for each of the at least some read thresholds; computing a divergence metric for each read threshold; searching for a minimum of the voltage threshold distribution around every read threshold of the multiple read thresholds; calculating a read threshold score based upon a divergence metric of the read threshold, a hard decoding score of the read threshold and a minimum of the voltage threshold distribution around the read threshold; determining if, based upon read threshold scores assigned to the multiple read thresholds, labels to reliability metrics can be determined; if it is determined that labels to reliability metrics can be determined then applying the labels to the reliability metrics and starting soft decoding; if it is determined that labels to reliability metrics can not be determined then activating a partial soft decoding to calculate partial soft decoding scores per read threshold; calculating a new read threshold score for each read threshold based upon a partial soft decoding score of the read threshold and voltage threshold distribution around the read threshold; and applying the labels to the reliability metrics and starting soft decoding.

According to an embodiment of the invention a method may be provided and may include reading a flash memory array using multiple read thresholds that are positioned around one or more initial read thresholds; determining if an optimal hard read threshold can be determined; if it is determined that the optimal hard read threshold can not be determined then performing more read attempts using additional read thresholds; if it is determined that the optimal hard read threshold can be determined then setting additional read thresholds for high resolution read soft decoding; associating every read threshold with a reliability metric; and performing soft error correction decoding.

According to an embodiment of the invention a method may be provided and may include starting a soft decoding process; choosing, based on hard decoding scores, a subset of possible labels to reliability metrics hypotheses; performing partial soft decoding for every hypothesis; selecting a desired read threshold based on likelihood scores obtained during the partial soft decoding; and completing the soft decoding process taking into account the desired read threshold.

Further embodiments of the invention include a computer readable medium that is non-transitory and may store instructions for performing the above-described methods and any steps thereof, including any combinations of same. For example, the computer readable medium may store instructions for performing, by a flash memory controller, multiple read attempts of a group of flash memory cells, using multiple read thresholds, to provide multiple read results;

determining, by the flash memory controller and based upon the multiple read results, a reliability metric of each of the multiple read results; and error correction decoding the multiple read results based upon reliability metrics associated with the multiple read results.

Further embodiments of the invention include a computer readable medium that is non-transitory and may store instructions for performing the above-described methods and any steps thereof, including any combinations of same. For example, the computer readable medium may store instructions for reading a flash memory array using multiple read thresholds that are positioned around one or more initial read thresholds; determining if an optimal hard read threshold can be determined; if it is determined that the optimal hard read threshold can not be determined then performing more read attempts using additional read thresholds; if it is determined that the optimal hard read threshold can be determined then setting additional read thresholds for high resolution read soft decoding; associating every read threshold with a reliability metric; and performing soft error correction decoding.

Further embodiments of the invention include a computer readable medium that is non-transitory and may store instructions for performing the above-described methods and any steps thereof, including any combinations of same. For example, the computer readable medium may store instructions for starting a soft decoding process; choosing, based on hard decoding scores, a subset of possible labels to reliability metrics hypotheses; performing partial soft decoding for every hypothesis; selecting a desired read threshold based on likelihood scores obtained during the partial soft decoding; and completing the soft decoding process taking into account the desired read threshold.

Further embodiments of the invention include a computer readable medium that is non-transitory and may store instructions for performing the above-described methods and any steps thereof, including any combinations of same. For example, the computer readable medium may store instructions for starting a search for near optimum reliability metrics mapping related to multiple read thresholds; computing a histogram that represents a voltage threshold distribution obtained when performing multiple read attempts using the multiple read thresholds; activating a particle hard decoding for at least some of the multiple read thresholds and calculating a hard decoding score for each of the at least some read thresholds; computing a divergence metric for each read threshold; searching for a minimum of the voltage threshold distribution around every read threshold of the multiple read thresholds; calculating a read threshold score based upon a divergence metric of the read threshold, a hard decoding score of the read threshold and a minimum of the voltage threshold distribution around the read threshold; determining if, based upon read threshold scores assigned to the multiple read thresholds, labels to reliability metrics can be determined; if it is determined that labels to reliability metrics can be determined then applying the labels to the reliability metrics and starting soft decoding; if it is determined that labels to reliability metrics can not be determined then activating a partial soft decoding to calculate partial soft decoding scores per read threshold; calculating a new read threshold score for each read threshold based upon a partial soft decoding score of the read threshold and voltage threshold distribution around the read threshold; and applying the labels to the reliability metrics and starting soft decoding.

Additional embodiments of the invention include a system arranged to execute any or all of the methods described above, including any stages—and any combinations of same. For example, the system may include a flash memory controller that may include a read circuit that me be arranged to perform multiple read attempts of a group of flash memory cells, using multiple read thresholds, to provide multiple read results; a reliability circuit that may be arranged to determine, based upon the multiple read results, a reliability metric of each of the multiple read results; and an error correction decoding circuit that may be arranged to perform error correction decoding of the multiple read results based upon reliability metrics associated with the multiple read results.

The flash memory controller may include a read threshold circuit that may be arranged to find, based upon the multiple read results, at least one desired read threshold to be applied during future read attempts.

Additional embodiments of the invention include a system arranged to execute any or all of the methods described above, including any stages—and any combinations of same. For example, the system may include a flash memory controller that may include a read circuit that may be arranged to read a flash memory array using multiple read thresholds that are positioned around one or more initial read thresholds; a read threshold circuit that may be arranged to determine if an optimal hard read threshold can be determined; if it is determined that the optimal hard read threshold can not be determined then the read circuit that may be arranged to perform more read attempts using additional read thresholds; if it is determined that the optimal hard read threshold can be determined then the flash memory controller that may be arranged to set additional read thresholds for high resolution read soft decoding; associate every read threshold with a reliability metric; and perform soft error correction decoding.

Additional embodiments of the invention include a system arranged to execute any or all of the methods described above, including any stages—and any combinations of same. For example, the system may include a flash memory controller that may include a error correction decoding circuit, a reliability circuit and a read threshold circuit; wherein the error correction decoding circuit that may be arranged to start a soft decoding process; the reliability circuit that may be arranged to choose, based on hard decoding scores, a subset of possible labels to reliability metrics hypotheses; the error correction decoding circuit is further that may be arranged to perform partial soft decoding for every hypothesis; the read threshold circuit that may be arranged to select a desired read threshold based on likelihood scores obtained during the partial soft decoding; and the error correction decoding circuit that may be arranged to complete the soft decoding process taking into account the desired read threshold.

Additional embodiments of the invention include a system arranged to execute any or all of the methods described above, including any stages—and any combinations of same. For example, the system may include a flash memory controller that may include a read circuit, a reliability circuit, a read threshold circuit and an error correction decoding circuit; wherein the flash memory controller that may be arranged to compute a histogram that represents a voltage threshold distribution obtained when performing multiple read attempts using the multiple read thresholds; activate a particle hard decoding for at least some of the multiple read thresholds and calculate a hard decoding score for each of the at least some read thresholds; compute a divergence metric for each read threshold; search for a minimum of the voltage threshold distribution around every read threshold of the multiple read thresholds; calculate a read threshold score based upon a divergence metric of the read threshold, a hard decoding score of the read threshold and a minimum of the voltage threshold distribution around the read threshold; determine if, based upon read threshold scores assigned to the multiple read thresholds, labels to reliability metrics can be determined; if it is determined that labels to reliability metrics can be determined then apply the labels to the reliability metrics and starting soft decoding; if it is determined that labels to reliability metrics can not be determined then activate a partial soft decoding to calculate partial soft decoding scores per read threshold; calculate a new read threshold score for each read threshold based upon a partial soft decoding score of the read threshold and voltage threshold distribution around the read threshold; and apply the labels to the reliability metrics and starting soft decoding.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
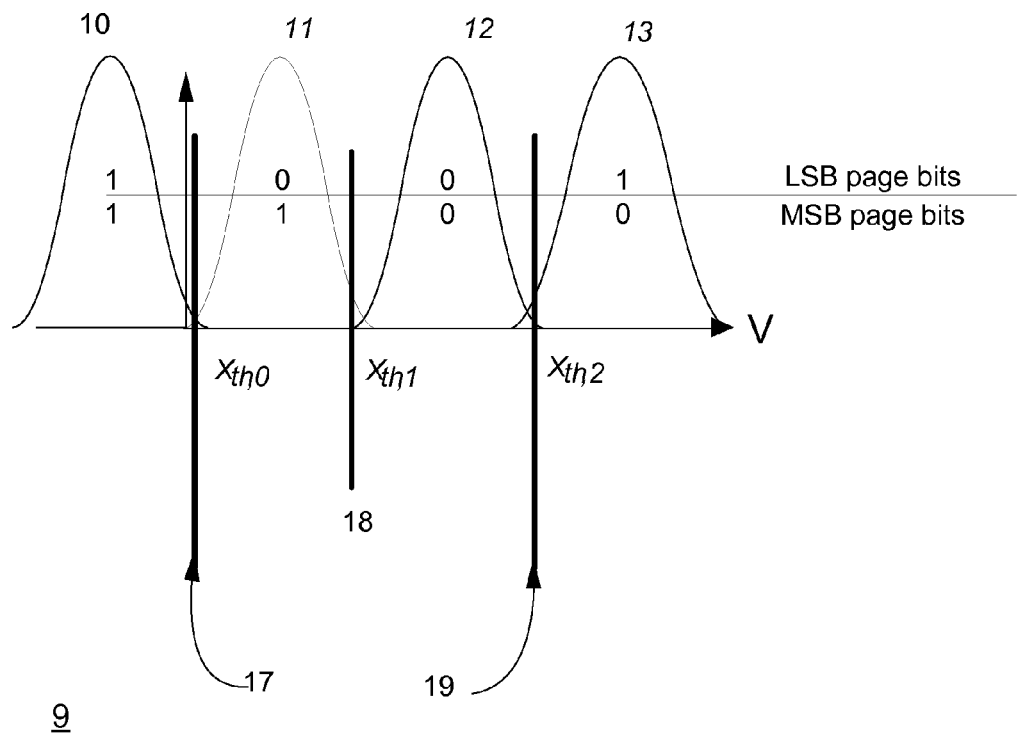
FIG. 1 illustrates a prior art voltage threshold distribution.
Figure 2:
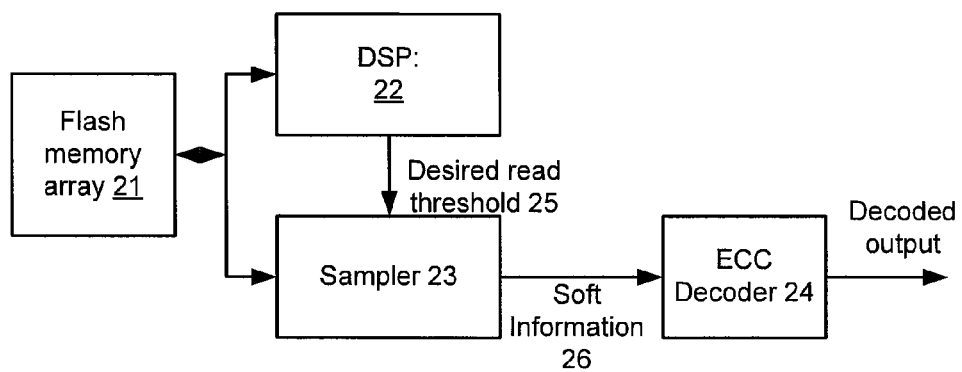
FIG. 2 illustrate a prior art system.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

The following terms may be construed either in accordance with any definition thereof appearing in the prior art literature or in accordance with the specification, or as follows:

Bit error rate (BER): a proportion of incorrectly read bits. The BER may be measured right after reading at the input to the ECC decoder, or at the output of the decoder.

Undecodable Bit error rate (UBER): a parameter that a flash memory device manufacturer commits to vis a vis its customers, expressing the maximum proportion of wrongly read bits (wrongly read bits/total number of bits) that users of the flash memory device need to expect at any time during the stipulated lifetime of the flash memory device, e.g. UBER<1E-15 after maximal P/E cycles and 10 years.

Block: a set of flash memory device cells which must, due to physical limitations of the flash memory device, be erased together. Also termed erase sector, erase block.

Cell: A component of flash memory that stores one bit of information (in single-level cell devices) or n bits of information (in a multi-level device having 2 exp n levels). Typically, each cell comprises a floating-gate transistor. "Multi-level" means that the physical levels in the cell are, to an acceptable level of certainty, statistically partitionable into multiple distinguishable regions, plus a region corresponding to zero, such that digital values each comprising multiple bits can be represented by the cell. In contrast, in single-level cells, the physical levels in the cell are assumed to be statistically partitionable into only two regions, one corresponding to zero and one other, non-zero region, such that only one bit can be represented by a single-level cell.

Charge level: the measured voltage of a cell which reflects its electric charge.

Cycling: Repeatedly programming new data into flash memory cells and repeatedly erasing the cells between each two writing operations.

Digital value or "logical value": n-tuple of bits represented by a cell in flash memory capable of generating 2 exp n distinguishable levels of a typically continuous physical value such as charge, where n may or may not be an integer.

Decoding: may refer to error correction decoding.

Erase cycle: The relatively slow process of erasing a block of cells (erase sector), each block typically comprising more than one page, or, in certain non-flash memory devices, of erasing a single cell or the duration of so doing. An advantage of erasing cells collectively in blocks as in flash memory, rather than individually, is enhanced programming speed: Many cells and typically even many pages of cells are erased in a single erase cycle.

Program erase (P/E) cycle: The process of erasing a block of cells (erase sector), each block typically comprising a plurality of pages, and subsequently writing new data into at least some of them. The terms "program" and "write" are used herein generally interchangeably.

Flash memory: Non-volatile computer memory including cells that are erased block by block, each block typically comprising more than one page, but are written into and read from, page by page. Includes NOR-type flash memory, NAND-type flash memory, and PRAM, e.g. Samsung PRAM, inter alia, and flash memory devices with any suitable number of levels per cell, such as but not limited to 2, 4, or 8.

Logical page: a portion of typically sequential data, whose amount is typically less than or equal to a predetermined amount of data defined to be a page full of data, which has typically been defined by a host (data source/destination) or user thereof, as a page, and which is sent by the host to a flash memory device for storage and is subsequently read by the host from the flash memory device.

Physical Page: A portion, typically 512 or 2048, 4096, 8192 or 16384 bytes in size, of a flash memory e.g. a NAND or NOR flash memory device. Writing and reading is typically performed physical page by physical page, as opposed to erasing which can be performed only at a granularity of an erase sector. A few bytes, typically 16-32 for every 512 data bytes are associated with each page (typically 16, 64 or 128 per page), for storage of error correction information. A typical block may include 32 512-byte pages, 64 2048-byte, 128 8192-bytes or 256 8192-bytes pages.

Alternatively, a physical page is an ordered set (e.g. sequence or array) of flash memory cells which are all written in simultaneously by each write operation, the set typically comprising a predetermined number of typically physically adjacent flash memory cells containing actual data written by and subsequently read by the host, as well as, typical error correction information and back pointers used for recognizing the true address of a page.

Program: same as "write".

Program level (programmed level, programming level): amount of charge originally induced in a cell to represent a given logical value, as opposed to "present level".

Retention: Retention of original physical levels induced in the flash memory cells despite time which has elapsed and despite previous erase/write cycles; retention is typically below 100% resulting in deterioration of original physical levels into present levels.

Retention time: The amount of time that data has been stored in a flash device, typically without, or substantially without, voltage having been supplied to the flash device i.e. the time which elapses between programming of a page and reading of the same page.

Threshold level or "decision level": the voltage (e.g.) against which the charge level of a cell is measured. For example, a cell may be said to store a particular digital n-tuple D if the charge level or other physical level of the cell falls between two threshold values T.

In the present specification, the terms "row" and "column" refer to rows of cells and columns of cells, respectively and are not references to sub-divisions of a logical page.

The term "MSB" is used herein to denote the bit which is programmed into a multi-level cell, storing several bits, first. The term "LSB" is used herein to denote the bit which is programmed into the multi-level cell, last. The term "CSB" is used herein to denote the bit which is programmed into a 3-level cell, storing 3 bits, second, i.e. after the MSB and before the LSB. It is appreciated that more generally, e.g. if the multi-level cell stores 4 or more levels, there are more than one CSB and use of the term "CSB" herein, which implies that the cell is a 3-level cell, is merely by way of example and is not intended to be limiting.

"Page read Bit errors" are those errors found in the physical page corresponding to a logical page, which typically are corrected using ECC (error correction code) such that the page is successfully reconstructed despite these errors.

The term "reading threshold" and "detection threshold" are used generally interchangeably.

The terms "sampling" and "reading" are used generally interchangeably.

The terms "read attempt" and "read attempt" are used generally interchangeably.

The term "high resolution" sampling refers to samplings using read thresholds that are proximate to each other—so that a difference between adjacent read thresholds may be smaller (and even much smaller) that a width of a threshold voltage distribution lobe. The distance can be 1/x of the width of the threshold voltage distribution lobe, wherein x may exceed 2. Typical values of x may range between 4 and 20.

The terms "cell" and "flash memory cell" are used generally interchangeably.

In the context of the present application, the term "programming" comprises the following operations: Take as input a sequence of bits to be stored in memory, transform respectively into "programmed values" which are physical values which are taken to represent these bits and induce the programmed values in cells of flash memory, resulting in physical values which cluster around the programmed values respectively. The term "program" in this application does not necessarily include the process of coding e.g. error correction coding in which redundancy bits are added. Typically, programming is a final procedure which transforms a sequence of binary logical values which have previously undergone processes such as scrambling, addition of CRC, and coding.

A programming process is a method for inducing given programmed values in flash memory cells. Typically, the programming process involves a sequence of voltage pulses applied to a flash memory cell, each pulse increasing the voltage level of the cell. After each such pulse, the process may determine whether or not to continue, depending on whether the programmed value has been achieved.

One or more read attempts can be included in a read operation. The outcome of a read attempt can be used for generating reliability metrics or for providing a decoding result.

Any reference to a method should be interpreted as referring to a device that may execute the method.

There may be provided methods, computer readable media and systems for joint DSP and ECC decoding operation with minimal sampling overhead. The overhead is mainly measured in read attempts, which are considerably reduced by the disclosed methods.

There may be provided methods, computer readable media and systems for joint memory sampling and reliability metrics mapping calculation using ECC.

The method may include multiple sampling (read attempts) and refinement of one or more read thresholds using: (a) minimum search (without decoder) from computation of the voltage threshold distribution (histogram) from the available samples—finding the read threshold that will provide the lowest number of errors; (b) divergence estimation from the histogram—for example by comparing the ratio of "1" cells and "0" cells and comprising to a desired ratio (such as 1:1 ratio); (c) Hard decoder activation for optimal threshold search and reliability metrics assignment—using partial hard decoding—activating the ECC decoder to perform a partial ECC decoding on results of the read attempts; and (d) Soft decoder activation for optimal threshold search and reliability metrics assignment—using partial soft decoding.

Partial soft decoding may be defined as a low complexity soft decoding process which does not necessarily decode all errors. Such partial decoding provides BER metrics which can be used to adjust the labels to reliability metrics mapping.

It is noted that the results of reading a flash memory array with each of the read thresholds can be stored and used for both threshold selection and soft decoding.

Figure 11:
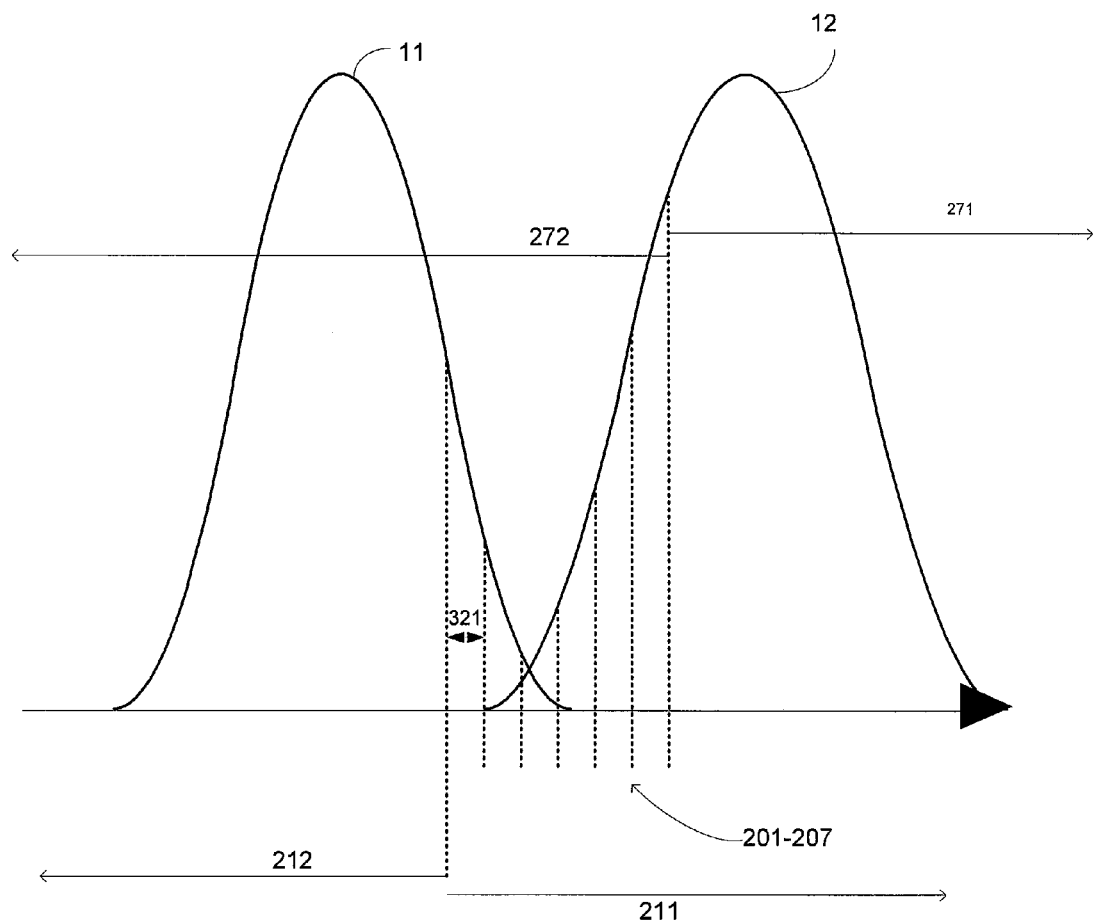
FIG. 11 illustrates read thresholds according to an embodiment of the invention.

Referring to FIG. 11 in which seven read thresholds 201-207 are shown. For each read threshold the method may count the number of cells of a flash memory array (that is read using that read threshold) that were read as "1" and those who were read as "0". These counts and, additionally or alternatively, the ratio between the number of "0" cells and "1" cells can be used to provide a histogram and, additionally or alternatively, to evaluates the reliability of such thresholds. For example, referring to read threshold 201—the number of flash memory cells in range 212 can be counted and can be compared to the number of cells that belong to range 211.

Yet according to another embodiment of the invention the histogram or any other manner for providing soft information can take into account the number of cells between read thresholds—such as the number of cells that their voltage threshold lies in range 321 between read thresholds 201 and 202.

The method may include low resolution sampling to be used for assigning preliminary labels to reliability metrics mapping (performing few read attempts using different read thresholds and then trying to map reliability metrics to the results of these read attempts), followed by a refined high resolution sampling based on earlier processing. Recalculation of mapping, and soft decoding using all available samples where every read threshold combination is associated with a reliability metric.

Figure 12:
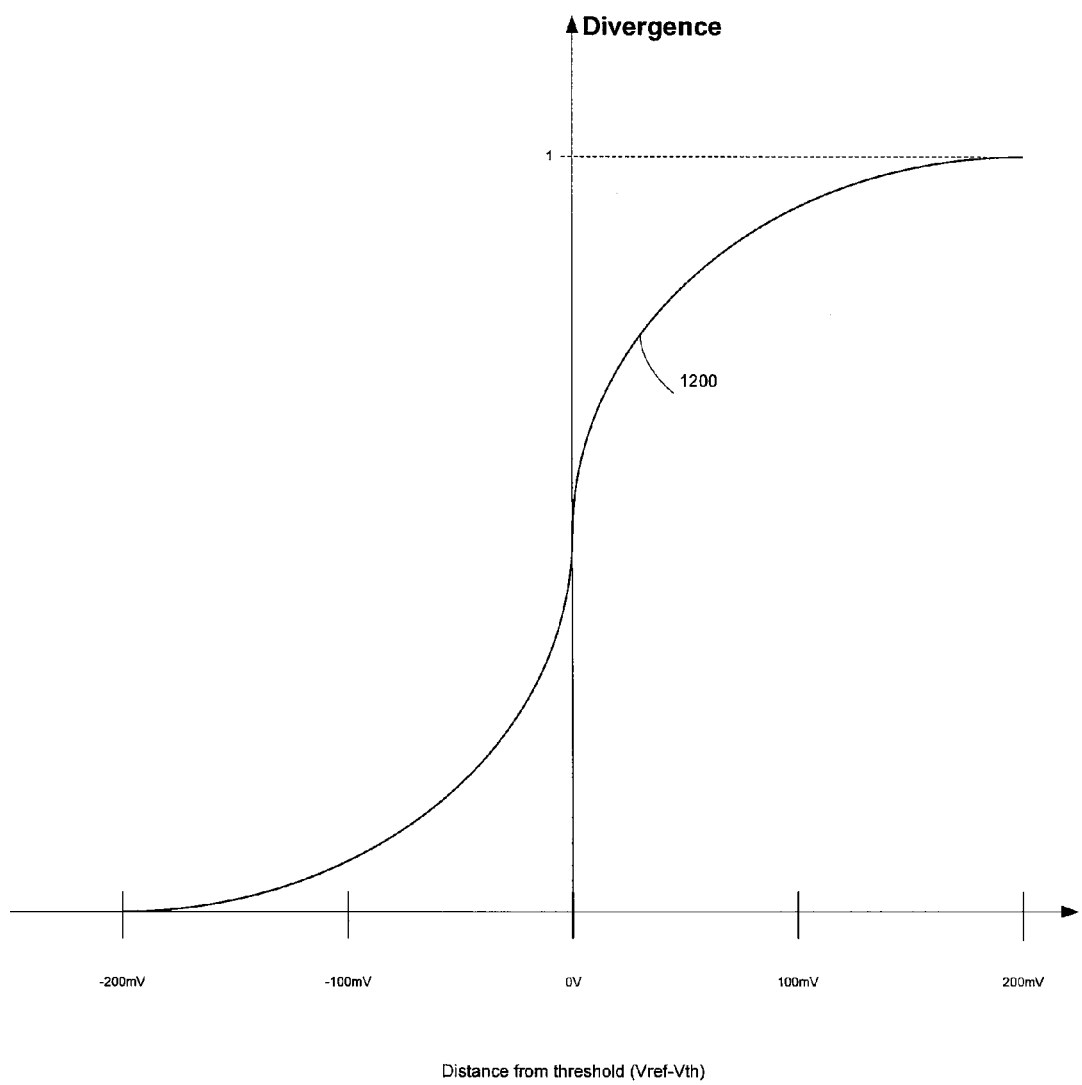
FIG. 12 illustrates a relationship between a voltage difference and a probability relating to a reliability of a read attempt.

The mapping can take into account the distance of each read threshold from the optimal read threshold and a probability that is related to the distance. Such a distribution is illustrated by curve 1200 of FIG. 12. In FIG. 12 the y-axis illustrates the ratio between '0' and '1' read results.

Curve 1200 that illustrates a symmetrical and non-linear relationship of a difference (dv) between a reference voltage provided to a flash memory cell and a desired (optimal or sub-optimal) threshold voltage of the flash memory cell and the probability to read "1" from a flash memory cell that was programmed to store "1".

If, for example a flash memory is read by providing to its gate a reference voltage (Vref) that equals its optimal threshold voltage (Vopt=Vref) then there is a ~50% probability to read "1" and about 50% probability to read "0". If, for example, Vref exceeds Vopt by at least 200 mVolts then there is about 100% to read "1". If, for example, Vref is lower from Vopt by at least 200 mV then there is about 100% to read "0". It is noted that the relationship may change from die to die and also over time—but can be measured, provided by the manufacturer or otherwise estimated or calculated.

Figure 3:
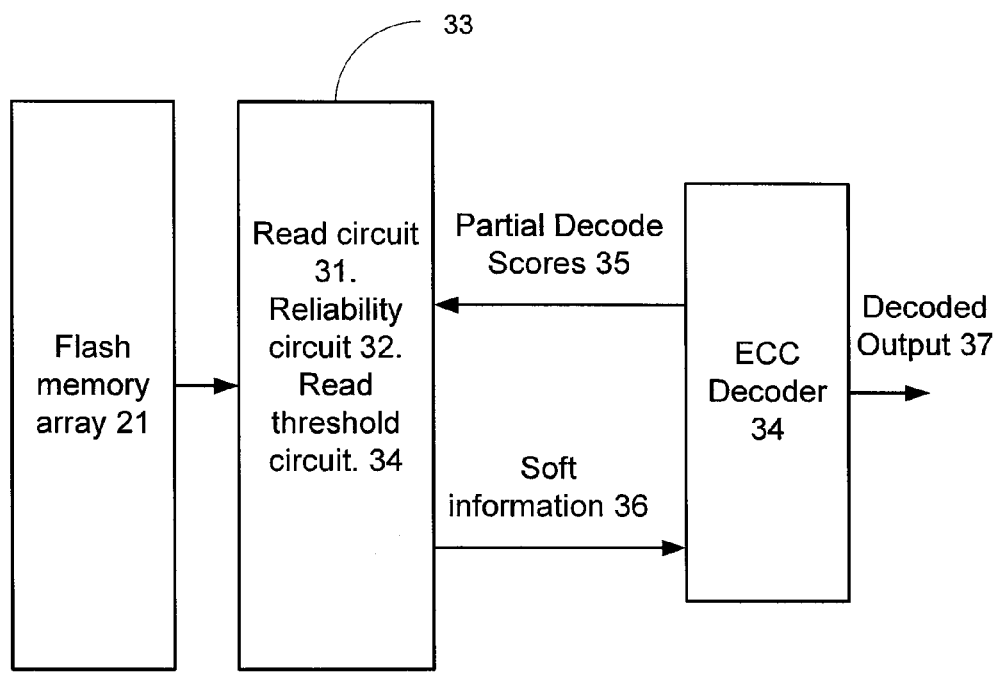
FIG. 3 illustrates a system according to an embodiment of the invention.

FIG. 3 illustrates a system 30 according to an embodiment of the invention.

The system 30 includes a flash memory array 21, a flash memory controller 33 and an ECC decoder 34. The flash memory controller 33 can include a read circuit 31, a reliability circuit 32 and a read threshold circuit 34. The flash memory controller 33 may be arranged to perform a joint DSP and high resolution sampling.

FIG. 3 illustrates that the flash memory controller 33 sends soft information 36 to the ECC decoder 34 but it is noted that it can also send other information (like hard information resulting from read attempts) and can receive from the ECC decoder 34 partial decoding scores 35.

The flash memory controller 33 can jointly perform read threshold estimation and high resolution sampling. Thus, near optimum read thresholds are estimated jointly with the soft read attempts, while possibly receiving soft scores from the decoder during the sampling as to assess the further recommended sampling thresholds.

This approach may reduce up to 50% in the number of read attempts required for obtaining decoder inputs at high resolution metrics.

The system 30 of FIG. 3 may perform sampling around initial read thresholds, and then adjust the reliability-metrics per bit according to decoder scores for different metrics mapping hypotheses. Decoder scores can be provided by a partial decoding process of hard or soft decoding. The partial decoding may include a small and limited number of decoding iterations, and or a limited complexity for the decoder, e.g. only part of the component codes which define the code are decoded, etc.

The system 30 may minimize the inherent overhead in producing decoder soft information input. This overhead usually involves read attempts solely intended for characterizing the current page/codeword associated memory cells' statistical distribution. Once the statistical characterization is sufficiently revealed, it is possible to perform soft sampling, which provides a high resolution from the memory cells, to be used by the decoder.

The system 30 may use results of the read attempts which are used for statistical characterization as part of the soft information. If needed, complement the statistical characterization process using the ECC. For example, partial decoding can be employed, and the ECC decoder 34 can provide scores per different input hypotheses (this is described in more detail later). Once the statistical characterization process is complete, additional read attempts may take place to provide a high resolution soft input, which can be, for example, a reliability-metric per input bit for the decoder.

Figure 4:
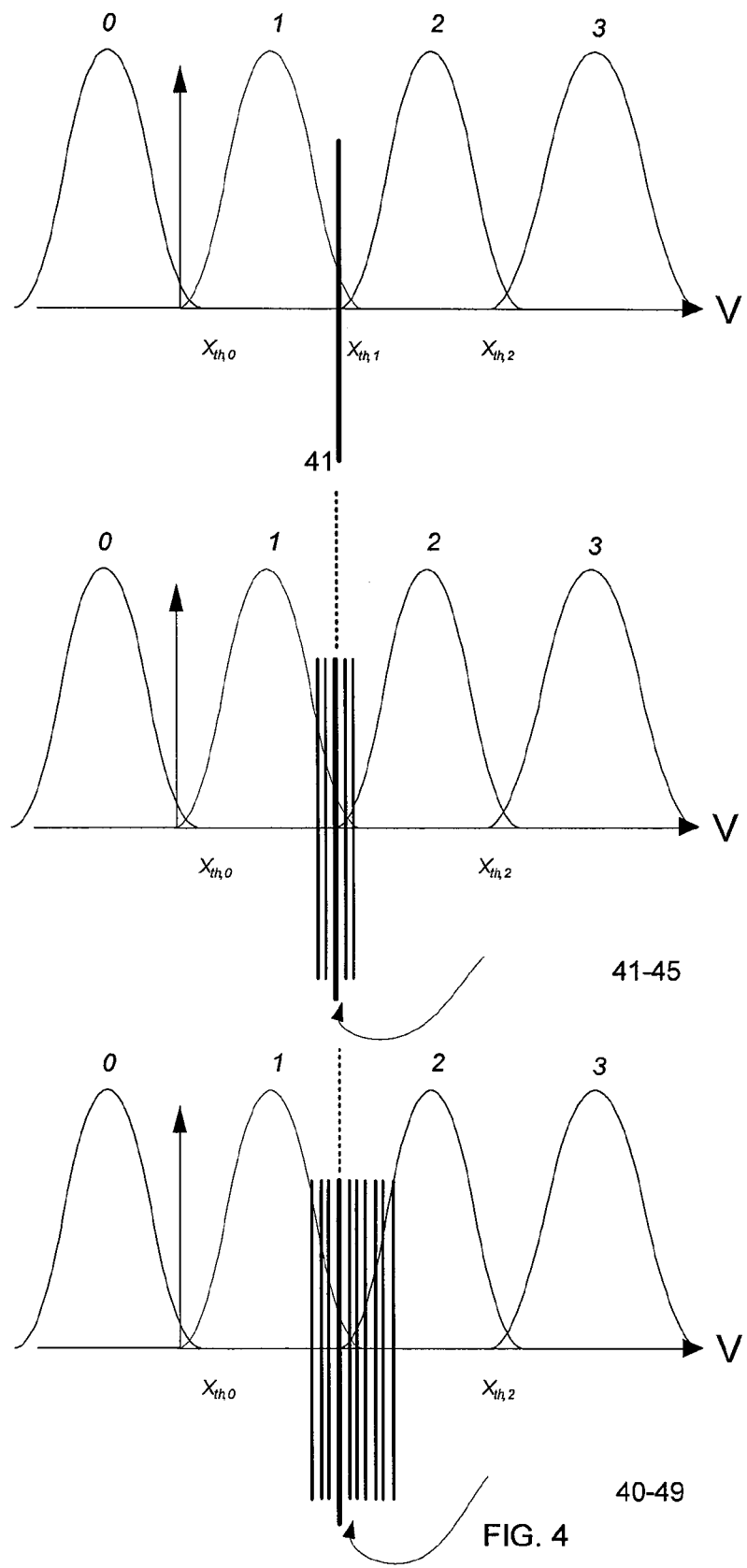
FIG. 4 illustrates three stages in a read threshold setting and soft decoding, according to an embodiment of the invention.
Figure 6:
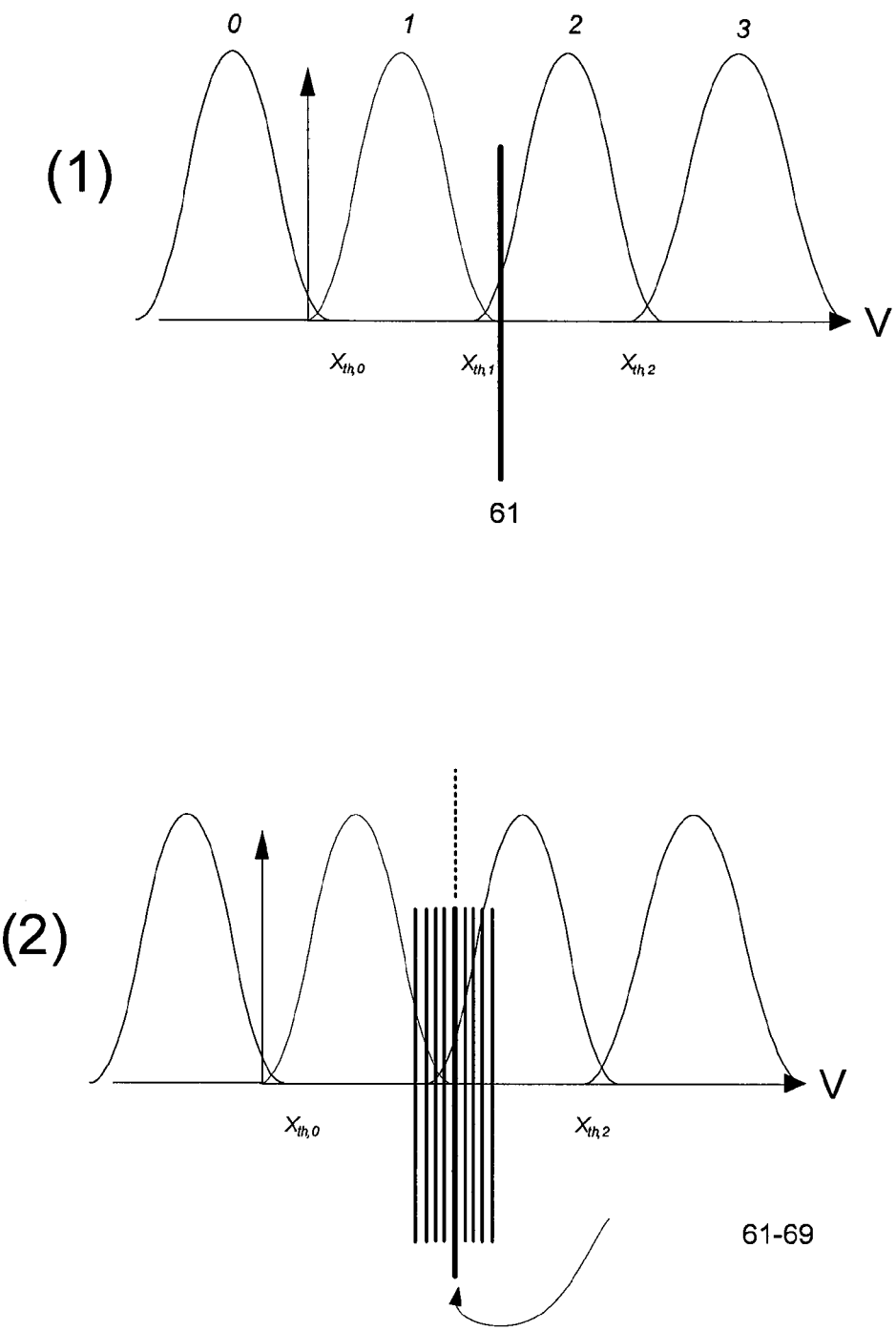
FIG. 6 illustrates two stages in a read threshold setting and soft decoding, according to an embodiment of the invention.

FIG. 4 illustrates three stages in a read threshold setting and soft decoding, according to an embodiment of the invention. FIG. 6 illustrate two stages in a read threshold setting and soft decoding, according to an embodiment of the invention.

These three stages can be initiated by a reception of a read command or by any other event such as errors found in previous read attempts, a lapse of a predefined period from the last update of read thresholds, arriving to a certain P/E count and the like.

The first stage (illustrated by the single read threshold of the upper part of FIG. 4) starts by setting an initial read threshold ($X_{th,1}$ 41) according to last used/default/estimated threshold for the relevant page. This does not involve a DSP executed operation for optimal read threshold search.

The second stage (illustrated by read thresholds 41-45) may include providing to an ECC decoder with high resolution input samples around the initial read threshold. This may include performing five read attempts with five different read thresholds 41-45 that are centered on the initial read threshold 41—two read thresholds at each side of the initial read threshold 41.

According to an embodiment of the invention every read result can also be labeled, such that the read results of thirty one read attempts can be represented by 5 bits per sampled cell—by a label.

The third stage (illustrated by the nine read thresholds of the lowest part of FIG. 4) may include finding the optimal read threshold and adding (if required) more read thresholds.

For example—assuming that the optimal threshold is read threshold 45 and there is a need to provide four read thresholds from each side of read threshold 45—then additional thresholds such as 40 (leftmost) and 47-49 are added—they are used to provide additional read results.

If, for another example, the optimal threshold is read threshold 41 and only two thresholds per side are required—then the third stage will not require additional read attempts with additional read thresholds.

Referring to FIG. 6—the initial read threshold 61 is not the optimal read threshold and additional read thresholds are defined to include read thresholds 61-69.

The results of the multiple read attempts (using each read threshold out of read thresholds 61-69)—or at least some of the results (for example those obtained while using read thresholds 41-45) can be used to find a desired read threshold—and this finding may use an initial mapping from label values to reliability metrics. This initial mapping can be converted to a desired mapping from labels to reliability metrics—based on the read results. The method may follow by using the desired mapping for soft decoding of the codewords stored in the flash memory device.

Figure 5:
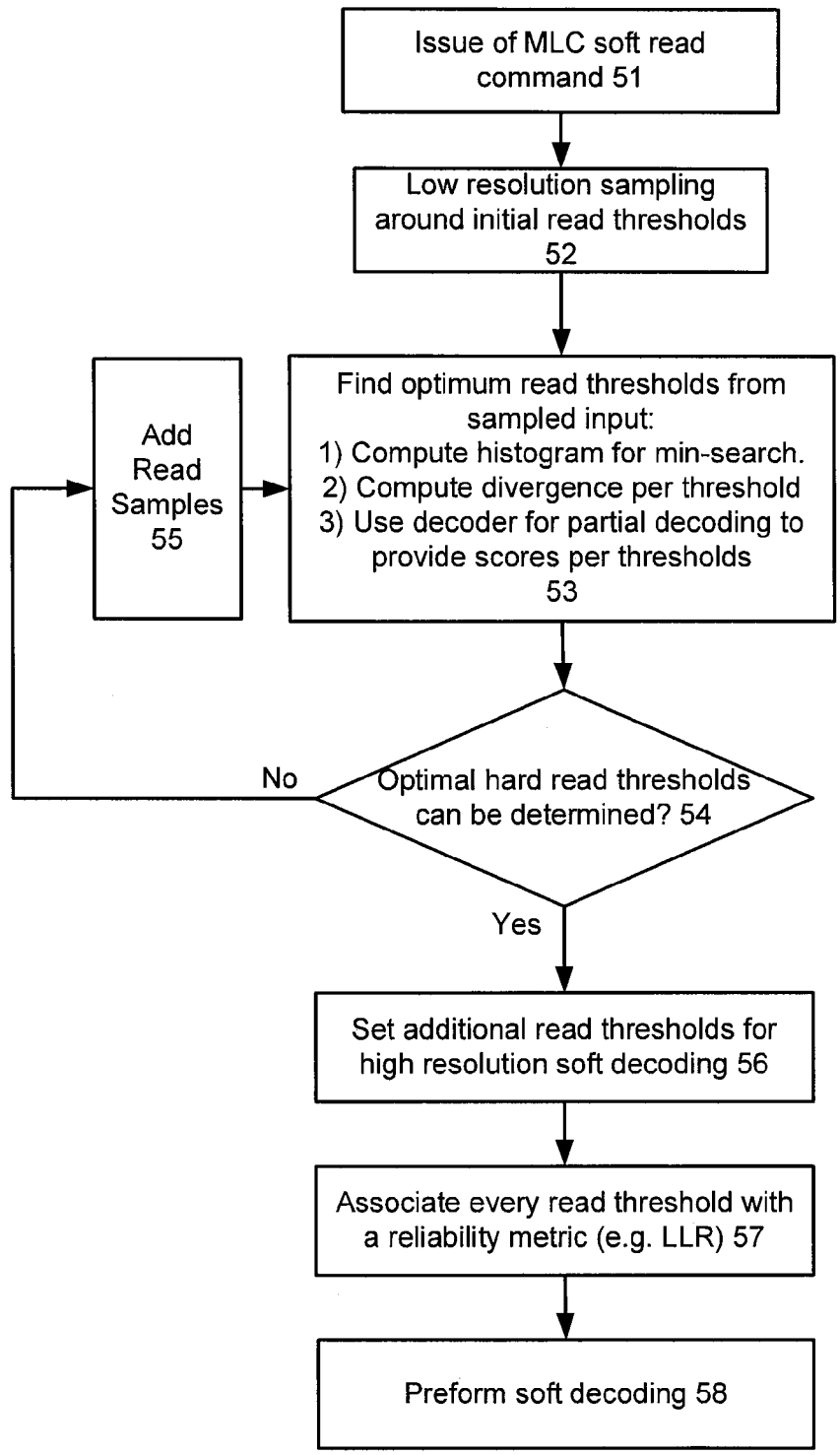
FIG. 5 illustrates a method according to an embodiment of the invention.

FIG. 5 illustrates method 50 according to an embodiment of the invention. This method illustrates a joint sampling and reliability metrics computation.

Method 50 includes the following stages:
a. Initialization stage. For example—by issuing a soft read command—such as a soft Multi Level Cell (MLC) or Single Level Cell (SLC) command (box 51).
b. Performing low resolution sampling around one or more initial read thresholds—reading a flash memory array using multiple read thresholds (box 52). The one or more initial read thresholds can be determined without having a prior DSP executed operation of finding the optimal read threshold. If SLC read is requested than only a single initial read threshold is used. If MLC read is required than multiple initial read thresholds are used.
c. Finding a selected (for example—a near optimum) read threshold out of the multiple read thresholds (box 53). This may include: (a) minimum search and divergence score (without decoder); (b) Hard decoder activation for optimal threshold search and reliability metrics assignment; or (c) soft decoder activation for optimal threshold search and reliability metrics assignment.

d. Determining (box 54) if the selected read threshold can be used as an optimal hard read threshold. For example—checking if there are enough read thresholds around the selected read threshold for an optimal hard read attempt. If the answer is positive then stage 54 is followed by stage 56. Else, stage 54 may be followed by stage 55 of adding read samples (performing more read attempts using new read thresholds) and jumping to stage 53.

e. Setting additional read thresholds for high resolution read soft decoding (box 56).

f. Associating every read threshold with a reliability metric—such as an LLR (box 57). The reliability metric can be calculated based on the distance between the read threshold and the optimal read threshold and using the non-linear relationship between this distance and reliability (for example—FIG. 12).

g. Performing soft decoding (box 58).

Figure 7:
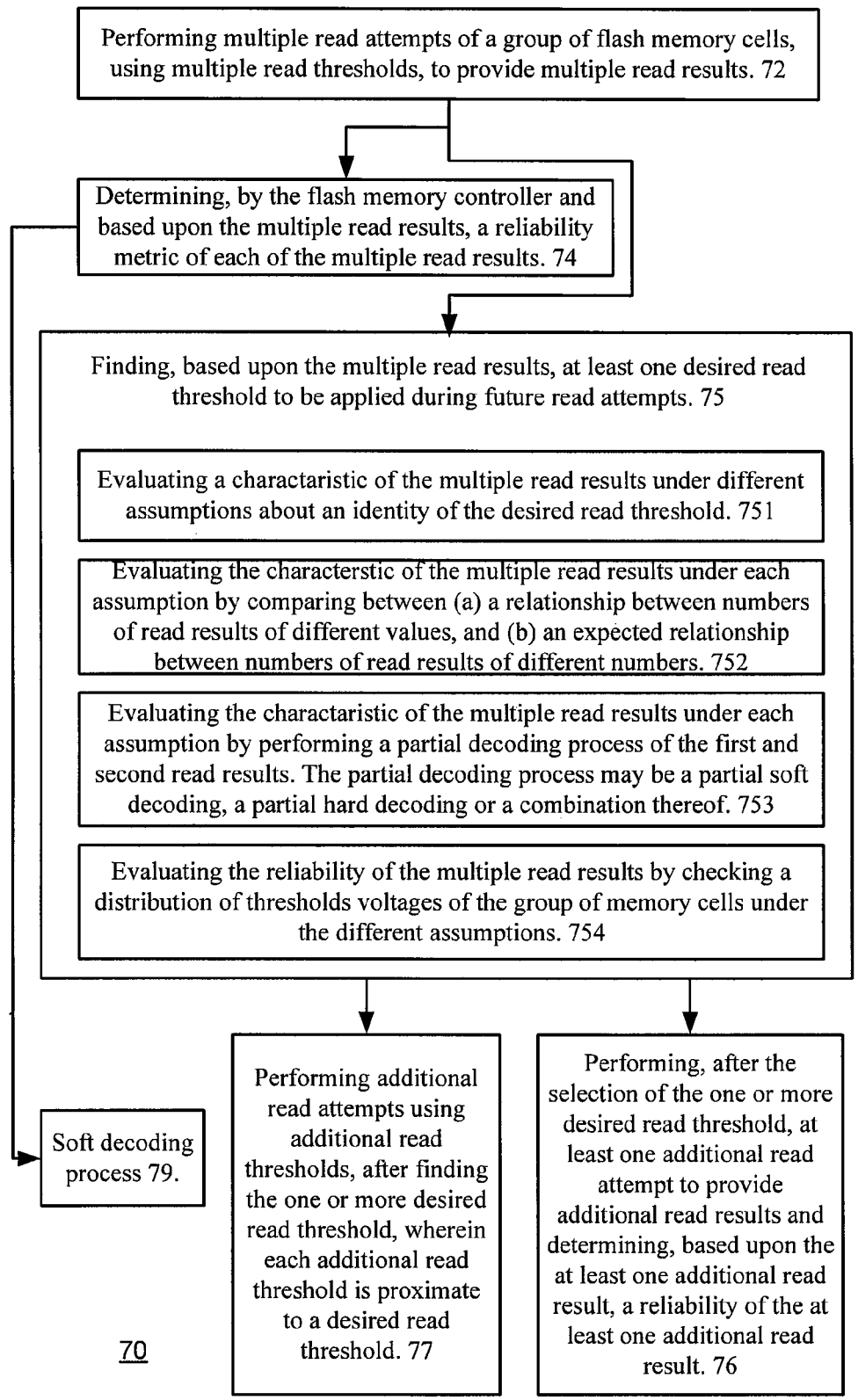
FIG. 7 illustrates a method according to an embodiment of the invention.

FIG. 7 illustrates method 70 according to an embodiment of the invention. This method illustrates a joint sampling and reliability metrics computation.

Method 70 may starts by stage 72 of performing multiple read attempts of a group of flash memory cells, using multiple read thresholds, to provide multiple read results. The group of the flash memory cells can be a page, a block, a portion of a page, a portion of a block or any other portion of a flash memory module.

The different read attempts differ from each other by threshold. If a single read threshold is looked for (for example—in SLC flash memory cells) the different read thresholds can be proximate to each other and proximate to (or include) an initial read threshold that is set without performing a dedicate DSP executed read threshold locating stage.

If MLC cells are read and there is a need to find multiple desired thresholds then the method can be repeated for each desired read threshold to be found. The multiple thresholds in this case can include multiple groups of read thresholds—a group of read thresholds per desired read threshold to be found. In x bit per cell flash memory cells there are $2^x$ groups of such read thresholds.

Stage 72 may be followed by stages 74 and 75.

Stage 74 may include determining, by the flash memory controller and based upon the multiple read results, a reliability metric of each of the multiple read results. The multiple read results and their associated reliability metrics can be fed to a soft decoder that may then perform a soft decoding process to provide decoded output—as illustrated by stage 79. Stage 79 may include error correction decoding the multiple read results based upon reliability metrics associated with the multiple read results.

Stage 75 may include finding, based upon the multiple read results, at least one desired read threshold to be applied during future read attempts.

Stage 75 may include stage 751 of evaluating a characteristic of the multiple read results under different assumptions about mappings between the read thresholds and reliability metrics. These assumptions can be equivalent to assumptions to an identity of the desired read threshold out multiple read thresholds that were used during stage 72. This evaluation can be much faster than a read attempt and thus multiple assumptions can be evaluated without inducing a substantial timing penalty.

The read threshold that is associated with the most reliable read results, or those which amount to a minimal amount of errors (after an execution of an error correction decoding process) can be selected to be the desired read threshold.

It is noted that the desired read threshold can be selected out of the multiple read threshold or can differ from each of these read thresholds. For example—a desired read threshold can have a value that is between two read thresholds or can be near one of the minimal or maxima read threshold of the multiple read thresholds.

Stage 75 may include stage 752 of evaluating the characteristic of the multiple read results under each assumption by comparing between (a) a relationship between numbers of read results of different values, and (b) an expected relationship between numbers of read results of different numbers.

Stage 75 may include stage 753 of evaluating the characteristic of the multiple read results under each assumption by performing a partial decoding process of the first and second read results. The partial decoding process may be a partial soft decoding, a partial hard decoding or a combination thereof.

Stage 75 may include stage 754 of evaluating the reliability of the multiple read results by checking a distribution of thresholds voltages of the group of memory cells under the different assumptions.

Stage 75 may be followed by stage 76 of performing, after the selection of the one or more desired read threshold, at least one additional read attempt to provide additional read results and determining, based upon the at least one additional read result, a reliability of the at least one additional read result.

Stage 75 may be followed by stage 77 of performing additional read attempts using additional read thresholds, after finding the one or more desired read threshold, wherein each additional read threshold is proximate to a desired read threshold. The additional read thresholds can be selected such that there are at least a predefined number of read thresholds that are proximate to each desired read threshold and are positioned at each side of the desired read threshold.

Soft Decoding Overview

For soft decoding of a codeword (also termed as packet) soft information per bit is required. This may be obtained by performing multiple read attempts of a flash memory device, where each read attempt uses different read thresholds. The read thresholds may be configured such that soft metrics, called log-likelihood ratio (LLR), can be computed per bit of the read results.

The definition of an LLR is LLR(bi)=LOG {(P(bi=1|y)/P(bi=1|y)}, where y is the channel output and bi is the i'th bit of some flash memory page.

The LLR expression can be substantially simplified, for an additive white Gaussian noise (AWGN) channel model. The AWGN is also a good approximation in many cases for the Flash lobes' distribution. By assuming an AWGN channel, $$P(b_i \mid y) = \frac{1}{\sqrt{2\pi\sigma^2}} \exp\left(-\frac{(y-b_i)^2}{2\sigma^2}\right),$$

where y is the AWGN channel output.

It is straightforward to show that the LLR(bi) becomes $$LLR(b_i) = \frac{2y}{\sigma^2},$$

where the LLR per bit is created during the multiple read attempts, as a quantized version of an AWGN channel.

The quantization level per threshold is directly determined by the number of reads, as the base-two logarithm of the read counter. Once the multiple read attempts have been conducted, and LLRs are available for all codeword bits, the decoding process begins.

There are many possible approximations for LLR values mapping for implementation efficiency, such as mapping to fixed point integer values.

Iterative soft decoding includes the process of performing soft decoding on some of the code components, while repeating the process iteratively, and applying the most likely corrections every iteration (under different conditions, as will be elaborated here). On some code components it may be desired to perform only hard decoding. An example for such code can be a 3D code where the outer components are BCH codes which correct t>4 errors, for which soft decoding complexity may be too high to consider, and thus only hard decoding is done for outer code components. If this code has inner-1 and inner-2 BCH components with decoding capability of t≤4, then soft decoding may be efficiently implemented here (in terms of computational complexity, or hardware implementation).

The soft decoding for a component code may include a notation of Sphere decoding. In particular, when using a BCH component code, this can include creating a list of candidates of the most likely error hypotheses. Perform BCH decoding for every candidate in the list, and compute a soft score for every decoding result by $$S_{LLR} = \sum_{b_m \in C} |LLR(b_m)|,$$

where C is the set of error bits, and $b_m$ is a location of an error bit.

Usually, the selected error hypothesis of a soft component decoder has the smallest $S_{LLR}$ score.

Sampling and Score Mapping

The sampling and score mapping can include calculating multiple reliability metrics to multiple read thresholds and using these metrics for soft decoding.

A method may be provided and may include calculating a probability density function (pdf) from the read results. Using the pdf, it is possible to determine the minimum of histograms that map the number of read results having different values, which may be associated with the optimal hard read threshold. This is usually the case when all lobes have identical symmetric distributions. However, when this is not so, the minimum of the pdf is not always the optimal hard read threshold. Therefore this stage can be provided for assigning a score per label. This is denoted in the figure by $S_{pdf}(i)$, where i is a threshold index. $S_{pdf}(i)$ can be computed is by the pdf values associated with a threshold from the computed histogram: $S_{pdf}(i)=f(i)$, where f(i) is the number of measured cells within a bin normalized by the total number of bits, defining an empirical pdf.

A method can be provided for finding the optimal label to soft metric mapping. It may include (a) obtaining multiple samples around initial read thresholds, (b) computing a probability density function (pdf) from the available input, (c) using the pdf to determine the minimum points of the histograms, which may be associated with the optimal hard read threshold. This is usually the case when all lobes have identical symmetric distributions. However, when this is not so, the minimum of the pdf may not be always the optimal hard read threshold. Therefore this stage may provide a score output per label.

Another score that can be computed from the pdf is the divergence score. The divergence aims to find how far is the distribution around a threshold from the expected distribution.

The divergence score may be defined, for example, as follows $Sd(i)=2^{\wedge}(-ND(p\|q))$, where N is the number of bits in a codeword, the phrase a^b is a by the power of b, q is the probability measured by the histogram, and p is the expected probability on the optimal threshold. The measure $D(p\|q)$ can be computed according to the Kullback-Leibler divergence.

The divergence score $S_D(i)$ can be responsive to a distance between a read threshold used during a certain read attempt and a desired threshold. An approximate computation can be carried out by counting the number of one-valued read results ('1') relative to the total number of bits in a codeword or relative to the number of zero-valued ('0') read results. For equally likely codeword distributions, i.e. p=0.5, it is expected that the empirical probability measure would be nearly 0.5. If the divergence is too far from p, the read threshold may be ignored.

Using the pdf scores $S_{pdf}(i)$ and the divergence scores $S_D(i)$, it is possible to perform a partial hard decoding. A partial hard decoding may include an efficient operation which uses some inner component codes for decoding. In case of BCH inner components, the partial decoding scores may be the actual number of corrected bits per inner BCH component (or some max value if the component cannot be corrected).

The sum of scores of all inner components may be denoted as $S_{Hard}(i)$, where again i is associated with a read threshold. These scores may reflect a coarse estimation of the number of errors associated with the read threshold. Then, the decision on optimum hard threshold may be done by combining the hard score $S_{Hard}(i)$, $S_D(i)$ and $S_{pdf}(i)$.

In general the combination may be defined via a function mapping $S_{pdfHard}(i)=f(S_{pdf}(i), S_D(i), S_{Hard}(i))$.

Another exemplary weighed combining of the scores can be $S_{pdfHard}(i)=S_{pdf}(i)+Ai*S_D(i)+Bi*SHard(i)$, where Ai and Bi are threshold dependent weights for combining the scores of the three stages described.

The method may follow by mapping the labels using the input scores $S_{pdfHard}(i)$ into reliability metric. The mapping may be done using the distribution of the associated voltage threshold lobes, which may be known in advance, or may be estimated.

According to the expected distribution, the estimation may be done separately, or directly from the weighted scores $S_{pdfHard}(i)$. If this mapping is successful (e.g. the scores correspond to a reference distribution), then the mapping can be provided from the soft decoder, where each label is directly mapped to a reliability metric, which the decoder uses for soft decoding.

The method may follow by soft decoder activation. If the soft decoder fails, or if the labels to reliability metrics mapping is not successful using $S_{pdfHard}(i)$, then the mapping can be done using partial soft decoding.

There is provided a method for performing partial soft decoding, the method may include: (A) Choosing, based on the hard/pdf scores $S_{pdfHard}(i)$, a subset of possible labels to reliability metrics hypotheses, (B) For every hypothesis performing partial soft decoding. When using, for example, BCH component code the partial decoding may include performing soft decoding per component on a small list of candidates, where the lowest sum-LLR of every component soft decoding can be saved in $S_{LLR}(k)$, where k is the code component index. If the code has a multi-dimensional structure, the partial soft decoding may include activating only a single soft decoding iteration per mapping hypothesis. (C) Combining the scores per hypothesis, which may be done as follows Ssoft(i)=SUM{$S_{LLR}(k)$}, for each k value. (D) Choosing the suitable label to reliability metrics mapping, which may provide the most likely soft decoder reliability metrics input, and (E) Activating the soft decoder.

A method may be provided and may include: (A) performing a low resolution sampling, for which the statistical characterization is computed, for example computing scores $S_{pdfHard}(i)$ and $S_{soft}(i)$, (B) From these scores it may be determined if further sampling is required. (C) If it is determined that no more sampling is required, then soft decoding may be issued based on the optimum selected mapping of labels to reliability metrics. (D) If it is determined that further sampling is needed, then the additional read attempts may be done according to last step results. Accordingly, $S_{pdfHard}(i)$ and $S_{soft}(i)$ may provide a score estimation per threshold obtained during the low resolution read.

This step may reveal the dynamic range available for the reliability metrics per lobe. Wherever the reliability metrics dynamic range is too small, further sampling might be required. Thus the selection of high resolution sampling can be done accurately.

According to the expected distribution, the estimation may be done separately, or directly from the weighted scores $S_{pdfHard}(i)$. If this mapping is successful (e.g. the scores correspond to a reference distribution), then the mapping can be provided from the soft decoder, where now every label is directly mapped to a reliability metric, which the decoder uses for soft decoding. Next stage clearly is a soft decoder activation. If the decoder fails, or if the labels to reliability metrics mapping is not successful using $S_{pdfHard}(i)$, then the mapping can be done using partial soft decoding.

Figure 10:
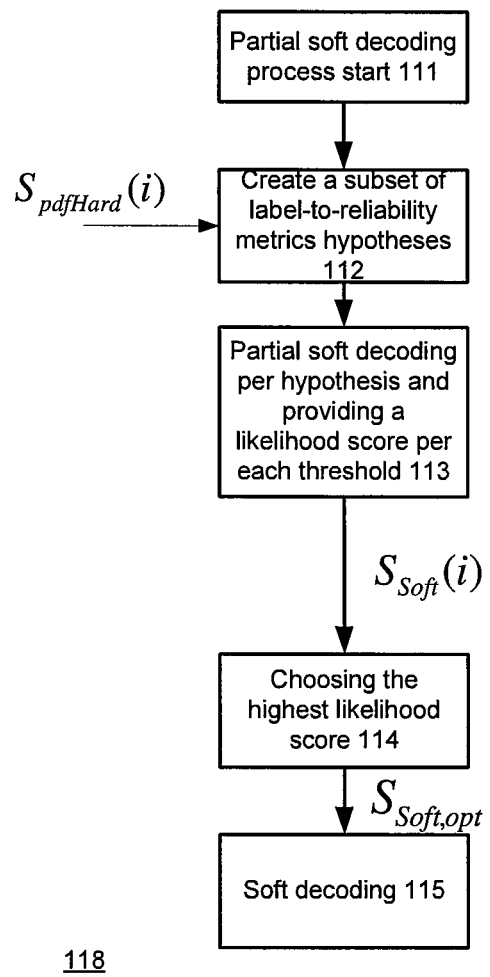
FIG. 10 illustrates a method according to an embodiment of the invention.

Partial soft decoding may be done, like described in FIG. 10, and it may include the following stages:
  a. Stage 111 of starting a soft decoding process.
  b. Based on the hard/pdf scores $S_{pdfHard}(i)$ choosing a subset of possible labels to reliability metrics hypotheses—stage 112.
  c. For every hypothesis performing partial soft decoding (stage 113). When using, for example, BCH component codes, within a concatenated coding scheme, the partial decoding may include performing soft decoding per component on a small list of candidates, where the lowest sum-LLR of every component soft decoding can be saved in $S_{LLR}(k)$, where k is the code component index. If the code has a multi-dimensional structure, the partial soft decoding may include activating only a single soft decoding iteration per mapping hypothesis. The soft decoding includes calculating a likelihood score per threshold—this may include combining the scores per hypothesis, which may be done as follows:

$$S_{Soft}(i) = \sum_k S_{LLR}(k).$$

d. Selecting (114) the desired read threshold based on the likelihood score. This may include selecting the read threshold associated with the highest score or otherwise choosing the suitable label to reliability metrics mapping, which provides the most likely soft decoder reliability metrics input.
  e. Activating a soft decoder and completing the soft decoding process (115).

Figure 9:
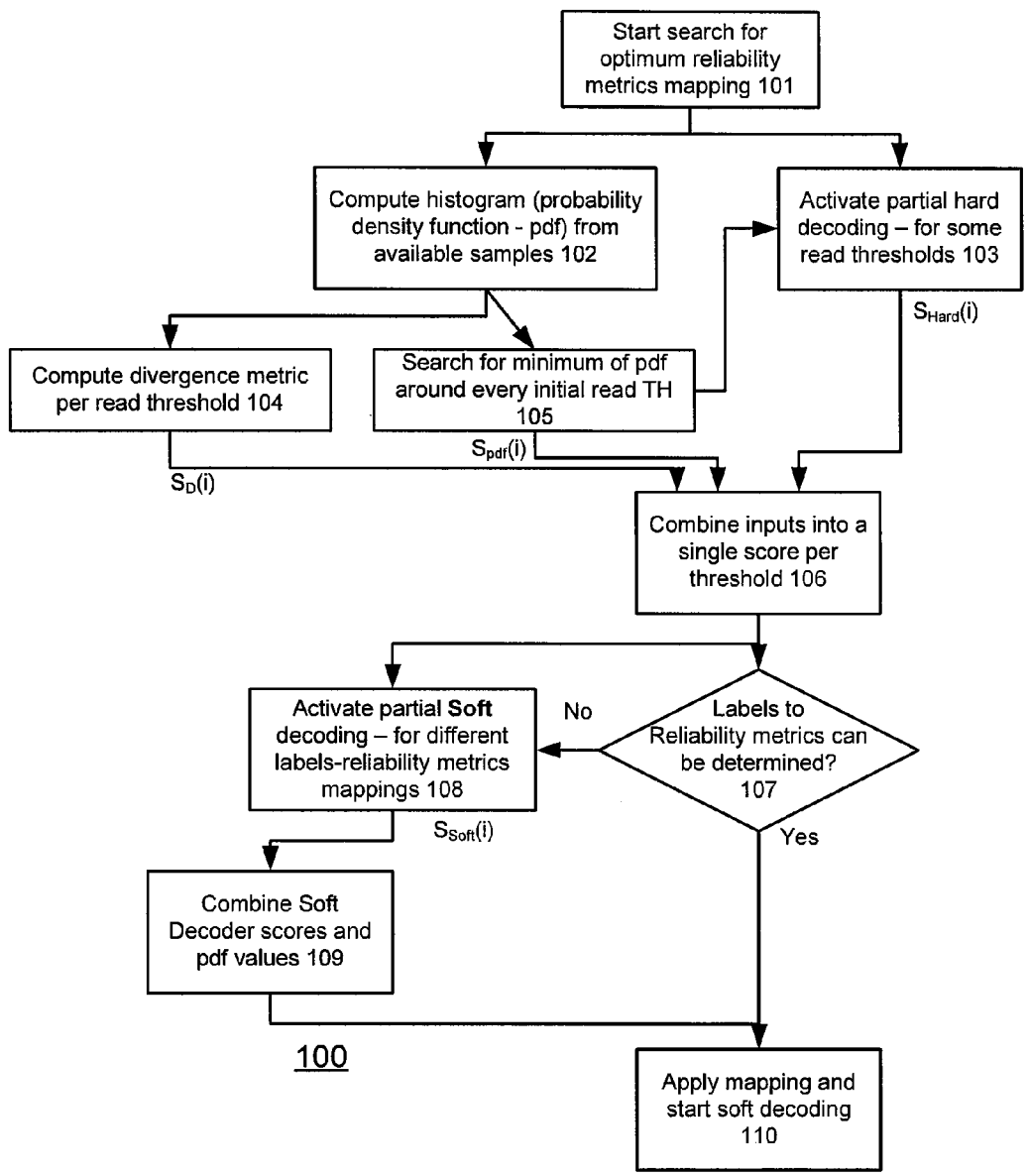
FIG. 9 illustrates a method according to an embodiment of the invention.

FIG. 9 illustrate method 90 according to an embodiment of the invention. Method 90 can assist in finding the optimal label to soft metric mapping.

Method 90 includes:
  a. Stage 101 of starting a search for near optimum reliability metrics mapping. Stage 101 is followed by stages 102 and 103.
  b. Stage 102 of computing a histogram that may represent the voltage threshold distribution and may be referred to as pdf. The histogram is computed from the results of multiple read attempts with different read thresholds. Each bin of the histogram is delimited by two read thresholds and represent the number of read results that changed their value between the two read thresholds.
  c. Stage 102 is followed by stages 104 and 105.
  d. Stage 103 includes activating a particle hard decoding—for some of the read thresholds and calculating $S_{hard}(i)$. Stage 103, 104 and 105 are followed by stage 106.
  e. Stage 104 includes computing a divergence metric for each read threshold—$S_D(i)$.
  f. Stage 105 includes searching for minimum of pdf around every initial read threshold—minimum pdf corresponds to a boarder of a lobe or to a crossing of two adjacent lobes. Referring to the example set forth in FIG. 11—the third read threshold 203 represents the minimal pdf value out of pdf values of other read thresholds. The pdf values are denoted $S_{pdf}(i)$. Stage 105 may be followed by stage 103 and 106.
  g. Stage 106 includes combining inputs into a single score per read threshold. Stage 106 is followed by stages 107 and 108.
  h. Stage 107 includes checking if labels to reliability metrics can be determined (based on the score)—if so stage 107 is followed by stage 110—else it is followed by stage 108. For Example—In order to determine if labels to reliability metrics can be computed, it may be possible for example to compare the score $S_{pdfHard}(i) \leq TH$ to a threshold. If the score is smaller than threshold TH then perform a partial soft activation.
  i. Stage 108 includes activating a partial soft decoding—for different labels-reliability metrics mappings. As an example, consider a set of hypotheses for labels to LLR mapping. For each candidate mapping activate a partial soft decoding. Partial soft decoding may consist for example of a single iteration decoding (instead of multiple iterations for full decoding). After a single iteration the sum-LLR scores may be ordered, a subset of the M smallest sum-LLRs may be taken and summed to provide a score $S_{soft}(i)$ for the $i^{th}$ mapping candidate. The mapping candidate with the smallest score may be chosen as the desired labels to LLR mapping, and is to be used for soft decoding. Stage 108 is followed by stage 109.
  j. Stage 109 includes combining soft ECC decoder scores and pdf values. Stage 109 is followed by stage 110.
  k. Stage 110 includes applying mapping and starting soft decoding.

According to an embodiment of the invention a method is provided and may include performing a first step of low resolution sampling, for which the statistical characterization is computed. Statistical characterization may be done according to steps disclosed earlier.

During these steps the scores $S_{pdfHard}(i)$ and $S_{soft}(i)$ can be computed. From these scores it may be determined if further sampling is required. If no more sampling is required, then soft decoding may be issued based on the near optimum selected mapping of labels to reliability metrics.

If further sampling is needed, then the additional read attempts may be done according to last step results. That is, $S_{pdfHard}(i)$ and $S_{soft}(i)$ provide a score estimation per threshold obtained during the low resolution read. This step may reveal the dynamic range available for the reliability metrics per lobe. Wherever the reliability metrics dynamic range is too small, further sampling might be required. Thus the selection of high resolution sampling can be done accurately.

An example for multi-stage sampling as described above is given in FIG. 6 that illustrates an MSB page type read. An initial read threshold 61 is available, maybe from previous successful read of this page, or from successful neighboring page reads, or from some earlier estimation, or a default value, etc. Around the initial threshold 61 a low resolution sampling can be done, like exemplified in stage (2)—to provide read thresholds 61-69.

In this case a total of additional eight read attempts are performed.

The results are labeled, and a DSP processing like described above is done. The result of this processing is a list of additional read thresholds for which sampling is required. Once all samples are available, the near optimum labels to reliability metrics mapping can be done, according to disclosed methods.

Figure 8:
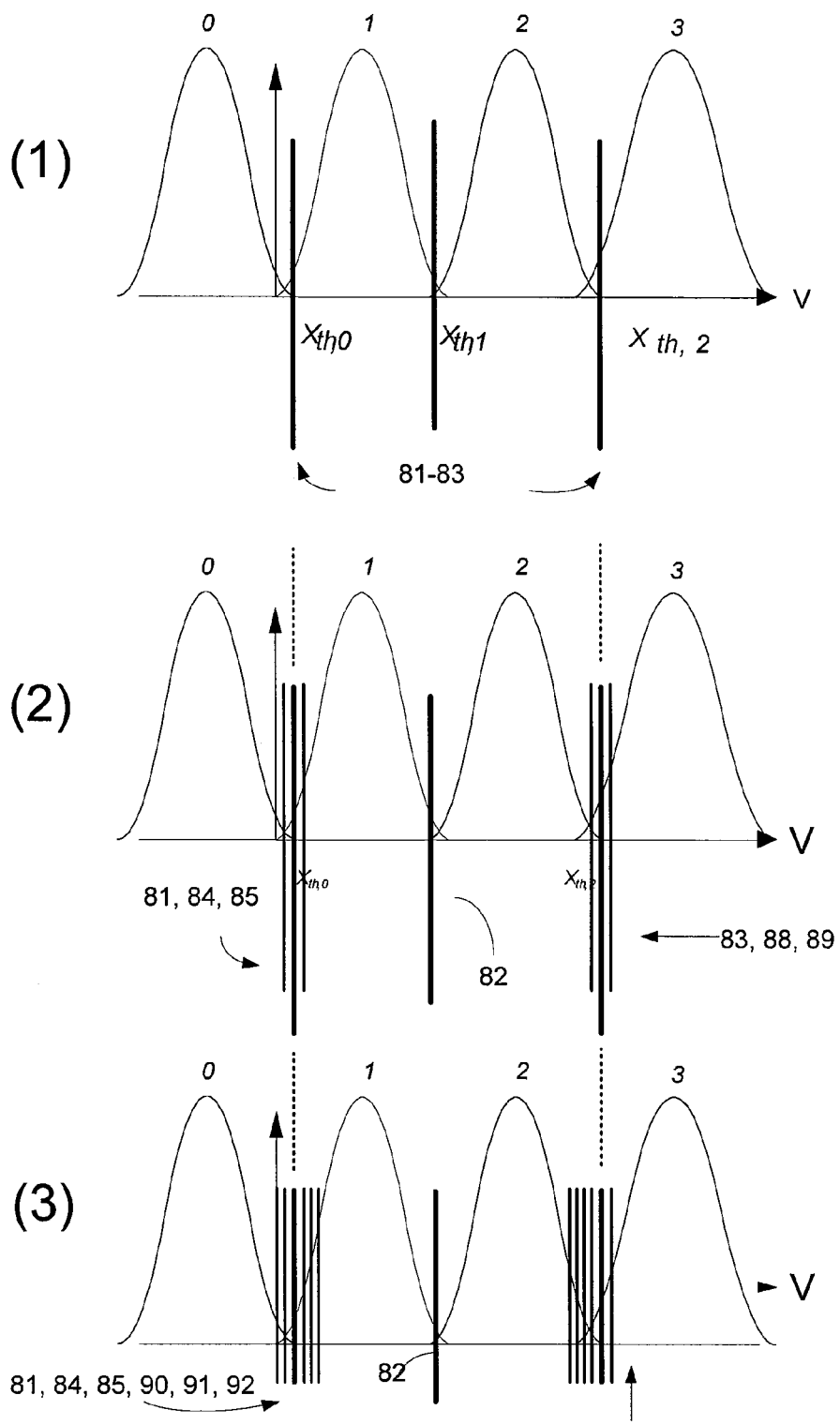
FIG. 8 illustrates various read thresholds according to an embodiment of the invention.

FIG. 8 demonstrates the same concept of low resolution sampling, for an LSB page. For reading an LSB page, read thresholds $X_{th,0}$, and $X_{th,2}$ are required. Initial read thresholds for $X_{th,0}$, 81 and $X_{th,2}$ 83 are available, maybe from previous successful read of this page, or from successful neighboring page reads, or from some earlier estimation, etc. Around the initial thresholds a low resolution sampling can be done, like exemplified in stage (2) of FIG. 8. In this case a total of additional 2 read attempts are performed per each LSB read threshold to provide LSB read thresholds 81, 84 and 85 as well as read thresholds 83, 88 and 89. This is because once an MSB hard read is done using $X_{th,1}$, then every read attempt for the low/high resolution sampling can be done with LSB page type reads.

For many reads this provides a two-fold read attempts reduction. For an LSB page of a 3 bpc device there can be nearly four-fold less read attempts. The read results of low resolution sampling are labeled, and a DSP processing like described above is done. The result of this processing is a list of additional read thresholds for which sampling (by LSB page reads) is required. FIG. 8 also illustrates additional read thresholds (stage (3))—that are centered on optimal read thresholds that may differ from the initial read thresholds.

Once all samples are available, the near optimum labels to reliability metrics mapping can be done, according to disclosed methods.

The extension to any multi-level Flash device with 3-bpc or 4-bpc for example is straightforward, and this invention, although demonstrated for 2 bpc Flash devices, covers any N-bpc Flash device.

The invention may also be implemented in a computer program for running on a computer system, at least including code portions for performing steps of a method according to the invention when run on a programmable apparatus, such as a computer system or enabling a programmable apparatus to perform functions of a device or system according to the invention.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on a non-transitory computer readable medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resource's. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connections that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A method comprising:
performing, by a flash memory controller, multiple read attempts of a group of flash memory cells, using multiple read thresholds, to provide multiple read results;
determining, by the flash memory controller and based upon the multiple read results, a reliability metric of each of the multiple read results;
error correction decoding the multiple read results based upon reliability metrics associated with the multiple read results; and
evaluating a characteristic of the multiple read results under different assumptions about mapping between the read thresholds and reliability metrics; wherein an evaluating of the characteristic of the multiple read thresholds under each assumption comprises comparing between (a) a relationship between numbers of first and second read results of the multiple read results and of different values, and (b) an expected relationship between numbers of first and second read results of different numbers.

2. The method according to claim 1 further comprising finding, based upon the multiple read results, at least one desired read threshold to be applied during future read attempts; wherein one or more desired read threshold out of the at least one desired read threshold is selected from the multiple read thresholds.

3. The method according to claim 1, further comprising finding, based upon the multiple read results, at least one desired read threshold to be applied during future read attempts; wherein one or more desired read threshold out of the at least one desired read threshold differs from each one of the multiple read thresholds.

4. The method according to claim 1, wherein the characteristic is a bit error rate metric associated with an outcome of a soft decoding process or a partial soft decoding process applied on the multiple read results.

5. The method according to claim 1, wherein the characteristic is a bit error rate metric associated with an outcome of a hard decoding process or a partial hard decoding process applied on the multiple read results.

6. The method according to claim 1, wherein the different assumptions about the identity of the desired read threshold differ from each other by a reliability associated with each of the multiple read results.

7. The method according to claim 1, comprising evaluating the characteristic of the multiple read thresholds under each assumption by performing a partial decoding process of the multiple read results.

8. The method according to claim 7, wherein the partial decoding is a partial soft decoding.

9. The method according to claim 8, wherein the partial soft decoding involve applying iterations of soft decoding of a lowest decoding complexity.

10. The method according to claim 7, wherein the partial decoding is a partial hard decoding.

11. The method according to claim 1, comprising evaluating the characteristic of the multiple read thresholds by checking a distribution of thresholds voltages of the group of memory cells under the different assumptions.

12. The method according to claim 1, further comprising finding, based upon the multiple read results, at least one desired read threshold to be applied during future read attempts; performing at least one additional read attempt to provide additional read results and determining, based upon the at least one additional read result, a reliability of the at least one additional read result.

13. The method according to claim 1, further comprising soft decoding the multiple read results.

14. The method according to claim 1, comprising finding, based upon the multiple read results, a desired read threshold to be applied during future read attempts; and performing additional read results using additional read thresholds, after finding the desired read threshold, wherein the additional read thresholds are proximate to the desired read threshold.

15. The method according to claim 1, wherein the multiple read attempts comprise first and second read attempts and wherein the first and second read attempts are executed before a completion of a determination of a desired read threshold.

16. A method comprising: performing, by a flash memory controller, multiple read attempts of a group of flash memory cells, using multiple read thresholds, to provide multiple read results; determining, by the flash memory controller and based upon the multiple read results, a reliability metric of each of the multiple read results; error correction decoding the multiple read results based upon reliability metrics associated with the multiple read results; finding, based upon the multiple read results, a desired read threshold to be applied during future read attempts; and performing additional read results using additional read thresholds, after finding the desired read threshold, wherein the additional read thresholds are proximate to the desired read threshold; wherein the additional read thresholds are selected such that there are at least a predefined number of read thresholds that are proximate to the desired read threshold and are positioned at each side of the desired read threshold, as to provide a decoder that performs the error correction decoding of the multiple read results with high resolution sampling for soft information.

17. A flash memory controller, comprising: a read circuit arranged to perform multiple read attempts of a group of flash memory cells, using multiple read thresholds, to provide multiple read results; a reliability circuit arranged to determine, based upon the multiple read results, a reliability metric of each of the multiple read results; and an error correction decoding circuit arranged to perform error correction decoding of the multiple read results based upon reliability metrics associated with the multiple read results; wherein the flash memory controller is further arranged to evaluate a characteristic of the multiple read results under different assumptions about mapping between the read thresholds and reliability metrics; wherein an evaluating of the characteristic of the multiple read thresholds under each assumption comprises comparing between (a) a relationship between numbers of first and second read results of different values, and (b) an expected relationship between numbers of first and second read results of different numbers.

18. The flash memory controller according to claim 17, further comprising a read threshold circuit arranged to find, based upon the multiple read results, at least one desired read threshold to be applied during future read attempts; wherein one or more desired read threshold out of the at least one desired read threshold is selected from the multiple read thresholds.

19. The flash memory controller according to claim 17, further comprising a read threshold circuit arranged to find, based upon the multiple read results, at least one desired read threshold to be applied during future read attempts; wherein one or more desired read threshold out of the at least one desired read threshold differs from each one of the multiple read thresholds.

20. The flash memory controller according to claim 17, wherein the characteristic is a bit error rate metric associated with an outcome of a soft decoding process or a partial soft decoding process applied on the multiple read results.

21. The flash memory controller according to claim 17, wherein the characteristic is a bit error rate metric associated with an outcome of a hard decoding process or a partial hard decoding process applied on the multiple read results.

22. The flash memory controller according to claim 17, wherein the different assumptions about the identity of the desired read threshold differ from each other by a reliability associated with each of the multiple read results.

23. The flash memory controller according to claim 17 that is arranged to evaluate the characteristic of the multiple read thresholds under each assumption by performing a partial decoding process of the multiple read results.

24. The flash memory controller according to claim 23, wherein the partial decoding is a partial soft decoding.

25. The flash memory controller according to claim 24, wherein the partial soft decoding involve applying iterations of soft decoding of a lowest decoding complexity.

26. The flash memory controller according to claim 23, wherein the partial decoding is a partial hard decoding.

27. The flash memory controller according to claim 17 that is arranged to evaluate the characteristic of the multiple read thresholds by checking a distribution of thresholds voltages of the group of memory cells under the different assumptions.

28. The flash memory controller according to claim 17 that is arranged to find, based upon the multiple read results, at least one desired read threshold to be applied during future read attempts; perform at least one additional read attempt to provide additional read results and determine, based upon the at least one additional read result, a reliability of the at least one additional read result.

29. The flash memory controller according to claim 17 that is arranged to soft decode the multiple read results.

30. The flash memory controller according to claim 17 that is arranged to find, based upon the multiple read results, a desired read threshold to be applied during future read attempts; and perform additional read results using additional read thresholds, after finding the desired read threshold, wherein the additional read thresholds are proximate to the desired read threshold.

31. The flash memory controller according to claim 17, wherein the multiple read attempts comprise first and second read attempts and wherein the first and second read attempts are executed before a completion of a determination of a desired read threshold.

32. A non-transitory computer readable medium that stores instructions for performing, by a flash memory controller, multiple read attempts of a group of flash memory cells, using multiple read thresholds, to provide multiple read results;
    determining, by the flash memory controller and based upon the multiple read results, a reliability metric of each of the multiple read results;
    error correction decoding the multiple read results based upon reliability metrics associated with the multiple read results;
    evaluating a characteristic of the multiple read results under different assumptions about mapping between the read thresholds and reliability metrics; wherein an evaluating of the characteristic of the multiple read thresholds under each assumption comprises comparing between (a) a relationship between numbers of first and second read results of different values, and (b) an expected relationship between numbers of first and second read results of different numbers.

33. The non-transitory computer readable medium according to claim 32 that stores instructions for finding, based upon the multiple read results, at least one desired read threshold to be applied during future read attempts; wherein one or more desired read threshold out of the at least one desired read threshold is selected from the multiple read thresholds.

34. The non-transitory computer readable medium according to claim 32 that stores instructions for finding, based upon the multiple read results, at least one desired read threshold to be applied during future read attempts; wherein one or more desired read threshold out of the at least one desired read threshold differs from each one of the multiple read thresholds.

35. The non-transitory computer readable medium according to claim 32, wherein the characteristic is a bit error rate metric associated with an outcome of a soft decoding process or a partial soft decoding process applied on the multiple read results.

36. The non-transitory computer readable medium according to claim 32, wherein the characteristic is a bit error rate metric associated with an outcome of a hard decoding process or a partial hard decoding process applied on the multiple read results.

37. The non-transitory computer readable medium according to claim 32, wherein the different assumptions about the identity of the desired read threshold differ from each other by a reliability associated with each of the multiple read results.

38. The non-transitory computer readable medium according to claim 32 that stores instructions for evaluating the characteristic of the multiple read thresholds under each assumption by performing a partial decoding process of the multiple read results.

39. The non-transitory computer readable medium according to claim 38, wherein the partial decoding is a partial soft decoding.

40. The non-transitory computer readable medium according to claim 39, wherein the partial soft decoding involve applying iterations of soft decoding of a lowest decoding complexity.

41. The non-transitory computer readable medium according to claim 38, wherein the partial decoding is a partial hard decoding.

42. The non-transitory computer readable medium according to claim 32 that stores instructions for evaluating the characteristic of the multiple read thresholds by checking a distribution of thresholds voltages of the group of memory cells under the different assumptions.

43. The non-transitory computer readable medium according to claim 32 that stores instructions for finding, based upon the multiple read results, at least one desired read threshold to be applied during future read attempts; performing at least one additional read attempt to provide additional read results and determining, based upon the at least one additional read result, a reliability of the at least one additional read result.

44. The non-transitory computer readable medium according to claim 32 that stores instructions for soft decoding the multiple read results.

45. The non-transitory computer readable medium according to claim 32 that stores instructions for finding, based upon the multiple read results, a desired read threshold to be applied during future read attempts; and performing additional read results using additional read thresholds, after finding the desired read threshold, wherein the additional read thresholds are proximate to the desired read threshold.

46. The non-transitory computer readable medium according to claim 32, wherein the multiple read attempts comprise first and second read attempts and wherein the first and second read attempts are executed before a completion of a determination of a desired read threshold.

47. A non-transitory computer readable medium that stores instructions for performing, by a flash memory controller, multiple read attempts of a group of flash memory cells, using multiple read thresholds, to provide multiple read results; determining, by the flash memory controller and based upon the multiple read results, a reliability metric of each of the multiple read results; error correction decoding the multiple read results based upon reliability metrics associated with the multiple read results;
    finding, based upon the multiple read results, a desired read threshold to be applied during future read attempts; and performing additional read results using additional read thresholds, after finding the desired read threshold, wherein the additional read thresholds are proximate to the desired read threshold;
    wherein the additional read thresholds are selected such that there are at least a predefined number of read thresholds that are proximate to the desired read threshold and are positioned at each side of the desired read threshold, as to provide a decoder that performs the error correction decoding of the multiple read results with high resolution sampling for soft information.

48. A flash memory controller, comprising: a read circuit arranged to perform multiple read attempts of a group of flash memory cells, using multiple read thresholds, to provide multiple read results; a reliability circuit arranged to determine, based upon the multiple read results, a reliability metric of each of the multiple read results; and an error correction decoding circuit arranged to perform error correction decoding of the multiple read results based upon reliability metrics associated with the multiple read results;
   wherein the flash memory controller is further arranged to
      find, based upon the multiple read results, a desired read threshold to be applied during future read attempts; and
   perform additional read results using additional read thresholds, after finding the desired read threshold, wherein the additional read thresholds are proximate to the desired read threshold;
   wherein the additional read thresholds are selected such that there are at least a predefined number of read thresholds that are proximate to the desired read threshold and are positioned at each side of the desired read threshold, as to provide a decoder that performs the error correction decoding of the multiple read results with high resolution sampling for soft information.

\* \* \* \* \*